(12) United States Patent
Sadakuni et al.

(10) Patent No.: US 9,657,224 B2
(45) Date of Patent: May 23, 2017

(54) FLUORESCENT-MATERIAL-CONTAINING RESIN SHEET AND LIGHT-EMITTING DEVICE

(71) Applicant: TORAY Industries, Inc., Tokyo (JP)

(72) Inventors: Hironobu Sadakuni, Otsu (JP); Takejiro Inoue, Otsu (JP); Tetsuya Yamamoto, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 115 days.

(21) Appl. No.: 14/436,227

(22) PCT Filed: Oct. 24, 2013

(86) PCT No.: PCT/JP2013/078793
§ 371 (c)(1),
(2) Date: Apr. 16, 2015

(87) PCT Pub. No.: WO2014/065358
PCT Pub. Date: May 1, 2014

(65) Prior Publication Data
US 2015/0240155 A1    Aug. 27, 2015

(30) Foreign Application Priority Data

Oct. 25, 2012  (JP) ................................ 2012-235384
Nov. 8, 2012   (JP) ................................ 2012-246059
Nov. 8, 2012   (JP) ................................ 2012-246060

(51) Int. Cl.
*H01L 33/50* (2010.01)
*H01L 33/00* (2010.01)
*C09K 11/77* (2006.01)
*C09K 11/02* (2006.01)

(52) U.S. Cl.
CPC .......... *C09K 11/7774* (2013.01); *C09K 11/02* (2013.01); *H01L 33/501* (2013.01); *H01L 33/502* (2013.01); *H01L 33/505* (2013.01); *H01L 2924/0002* (2013.01); *H01L 2933/0041* (2013.01)

(58) Field of Classification Search
CPC ................ A61B 17/085; A61B 18/042; A61B 2018/0063; A61B 2018/00452; A61B 2017/00504; A61B 2018/00619; A61B 2017/00004; A61M 13/00; A61M 2202/02; A61M 2205/3368; A61M 2202/0078; C09K 11/7774; C09K 11/02; H01L 33/501; H01L 33/502; H01L 33/505; H01L 2924/0002; H01L 2933/0041

See application file for complete search history.

(56) References Cited

U.S. PATENT DOCUMENTS

| 2001/0010367 A1 | 8/2001  | Burnell-Jones  |
| 2004/0094757 A1 | 5/2004  | Braune et al.  |
| 2012/0018761 A1 | 1/2012  | Honda          |
| 2013/0264601 A1 | 10/2013 | Matsumura et al. |

FOREIGN PATENT DOCUMENTS

| JP | 63-11541 U      | 1/1988 |
| JP | 2010-100743 A   | 5/2010 |
| WO | WO 2010/110204 A1 | 9/2010 |
| WO | WO 2012/081411 A1 | 6/2012 |

OTHER PUBLICATIONS

English translation of the Written Opinion of the International Searching Authority (Form PCT/ISA/237), dated Jan. 28, 2014, for International Application No. PCT/JP2013/078793.
Extended European Search Report, dated May 4, 2016, for European Application No. 13848535.4.
International Search Report, issued in PCT/JP2013/078793, dated Jan. 28, 2014.
Chinese Office Action, dated Sep. 1, 2016, for Chinese Application No. 201380055458.0.

*Primary Examiner* — Tracie Y Green
(74) *Attorney, Agent, or Firm* — Birch, Stewart, Kolasch & Stewart, LLP

(57) ABSTRACT

The present invention pertains to a fluorescent-material-containing resin sheet to be used as a light-emitting element. The present invention addresses the problem of obtaining a fluorescent-material-containing resin sheet which exhibits excellent formability, favorable light resistance, and favorable heat resistance, and when used as a light-emitting element, has high brightness and low variation in light emission between chips. As a means of solving this problem, this fluorescent-material-containing resin sheet contains a fluorescent material, a resin, and metal oxide particles (I) having an average particle diameter of 10-200 nm, wherein the amount of the fluorescent material contained therein is 250-1000 parts by mass per 100 parts by mass of the resin. Preferably, this sheet also contains metal oxide particles (II) having an average particle diameter of 300-1000 nm, and as a separate embodiment, preferably contains silicone fine particles.

18 Claims, No Drawings

US 9,657,224 B2

FLUORESCENT-MATERIAL-CONTAINING RESIN SHEET AND LIGHT-EMITTING DEVICE

TECHNICAL FIELD

The present invention relates to: a phosphor-containing resin sheet for converting an emission wavelength of an LED chip; and a light-emitting device using the same.

BACKGROUND ART

Backed by remarkable improvement in the light emitting efficiency, the market of light-emitting diodes (LEDs) has been rapidly expanding for backlights of liquid crystal displays (LCDs), vehicle headlights, spotlights and general lighting applications that are characterized by low power consumption, long service life and excellent design.

The emission color of an LED is limited because its emission spectrum is dependent on the semiconductor material for forming an LED chip. Therefore, in order to obtain white light from an LCD backlight or general lighting apparatus by using an LED, it is necessary that a phosphor suitable for an LED chip is arranged on the LED chip to convert an emission wavelength. Specifically, there have been proposed, for example, a method of arranging a yellow phosphor on a blue light-emitting LED chip, a method of arranging red and green phosphors on a blue light-emitting LED chip, and a method of arranging red, green and blue phosphors on a UV-emitting LED chip. Thereamong, from the standpoints of the light emitting efficiency and the cost of the LED chips, a method of arranging a yellow phosphor on a blue LED and a method of arranging red and green phosphors on a blue LED are most widely employed at present.

As a concrete method for arranging a phosphor on an LED chip, a method in which a phosphor is dispersed in a sealing resin of an LED chip has been proposed (see, for example, Patent Documents 1 and 2). However, when a phosphor is dispersed in a liquid sealing resin, it may not be able to supply the resulting liquid to each LED chip at a constant amount due to poor dispersion caused by precipitation of the phosphor having a large specific gravity. This leads to thickness variation of the sealing resin as well as the concentration of the phosphor, which causes color differences from one LED chip to another in some cases.

As a method of inhibiting such precipitation of a phosphor in a sealing resin, for example, a method of adding a thixotropic agent (see, for example, Patent Document 3) and a method of adding silicone fine particles (see, for example, Patent Document 4) have been proposed; however, when a phosphor is dispersed at a high concentration, it is difficult to sufficiently inhibit the precipitation of the phosphor.

In view of this, there has been proposed a method of using a resin in which a phosphor is uniformly distributed at a high concentration after molding it into a sheet form (see, for example, Patent Document 5). In this method, by molding a resin containing a phosphor at a high concentration into a sheet form in advance, uniform sheet thickness and uniform concentration distribution of the phosphor as well as light resistance can be attained; therefore, color variations of LEDs can be inhibited when the sheet is pasted to an LED package or a light-emitting element.

PRIOR ART REFERENCES

Patent Documents

[Patent Document 1] Japanese Patent Application Laid-Open Publication (JP-A) No. H5-152609
[Patent Document 2] Japanese Patent Application Laid-Open Publication (JP-A) No. 117-99345
[Patent Document 3] Japanese Translated PCT Patent Application Laid-open No. 2005-524737
[Patent Document 4] WO 2011/102272
[Patent Document 5] WO 2012/81411

SUMMARY OF THE INVENTION

Means for Solving the Problems

The use of a phosphor-containing resin sheet includes the step of processing the sheet into pieces in accordance with the size of each light-emitting element and the step of making a hole on a part corresponding to a position at which a light-emitting element is wire-bonded with a substrate. Therefore, it is indispensable that the sheet has physical properties suitable for these steps. However, when a resin sheet containing a phosphor at a high concentration is used, since the sheet itself is hard, there are various problems such as cracking during processing and poor ease of handling. Specifically, when such a phosphor-containing resin sheet is processed into pieces having a size of an LED package or light-emitting element or when the resulting pieces of the sheet are pasted to individual light-emitting elements, the sheet may be broken or a crack may be generated on the sheet. As a result, light emitted from an LED light-emitting element can leak through the crack of the sheet to cause color variation.

Further, when a phosphor is contained at a high concentration, there is also a problem that the phosphor absorbs a wavelength of light emitted from an LED chip and converts the wavelength to emit light and the phosphor itself re-absorbs the light, which results in a reduction in the brightness of a light-emitting element.

In view of the above-described circumstances, an object of the present invention is to provide a phosphor-containing resin sheet which exhibits good processability, light resistance and heat resistance as well as good optical properties.

Means for Solving the Problems

In order to solve the above-described problems, the present invention has the following constitutions.

(1) A phosphor-containing resin sheet, comprising: a phosphor; a resin; and metal oxide particles (I) having an average particle size of 10 to 200 nm, the phosphor-containing resin sheet containing the phosphor in an amount of 250 to 1,000 parts by mass with respect to 100 parts by mass of the resin.

(2) The above-described phosphor-containing resin sheet, further comprising metal oxide particles (II) having an average particle size of 300 to 1,000 nm.

(3) Any of the above-described phosphor-containing resin sheets, comprising silicone fine particles.

(4) A light-emitting device, in which any of the above-described phosphor-containing resin sheets is pasted on an LED light-emitting element.

(5) A method of producing a light-emitting device, the method comprising the step of pasting any of the above-described phosphor-containing resin sheets on an LED light-emitting element.

(6) A method of producing a phosphor-dispersed resin composition for preparation of a phosphor layer, the method comprising the step of mixing a phosphor, a resin and metal oxide particles, wherein the metal oxide particles mixed comprise at least metal oxide particles (I) having an average particle size of 10 to 200 nm, and the phosphor-dispersed resin composition comprises the phosphor in an amount of 250 to 1,000 parts by mass with respect to 100 parts by mass of the resin.

(7) The above-described method of producing a phosphor-dispersed resin composition, wherein the metal oxide particles mixed further comprise metal oxide particles (II) having an average particle size of 300 to 1,000 nm.

(8) Any of the above-described methods of producing a phosphor-dispersed resin composition, wherein silicone fine particles are further mixed in the step of mixing.

(9) A method of producing a phosphor-containing resin sheet, the method comprising: producing a phosphor-dispersed resin composition by any one of the above-described methods; subsequently coating the phosphor-dispersed resin composition on a base material; and drying the coated composition.

(10) A method of producing a light-emitting device, comprising the steps of: producing a phosphor-containing resin sheet by the above-described method; and subsequently pasting the phosphor-containing resin sheet on an LED light-emitting element.

Effects of the Invention

According to the present invention, a phosphor-containing resin sheet which has excellent processability, good light resistance and good heat resistance and, when used in a light-emitting element, shows small variation in light emission between chips, can be obtained. Further, according to a preferred embodiment of the present invention, a phosphor-containing resin sheet which yields a light-emitting material having good brightness can be obtained.

MODE FOR CARRYING OUT THE INVENTION

The phosphor-containing resin sheet of the present invention is a phosphor-containing resin sheet comprising a phosphor, a resin, metal oxide particles (I) having an average particle size of 10 to 200 nm and, preferably, metal oxide particles (II) having an average particle size of 300 to 1,000 nm, the phosphor-containing resin sheet comprising the phosphor in an amount of 250 to 1,000 parts by mass with respect to 100 parts by mass of the resin. It is preferred that the phosphor-containing resin sheet of the present invention further contain silicone fine particles.

Because of the reasons described below, this phosphor-containing resin sheet has excellent processability, ease of handling and light-emitting properties and is thus suitable as an LED wavelength conversion layer.

Since the phosphor-containing resin sheet of the present invention is obtained by molding a resin in which a phosphor is uniformly dispersed into a sheet form in advance, by pasting the phosphor-containing resin sheet to an LED package or a light-emitting element, a uniform and highly efficient emission color having only small color variation can be obtained. In the phosphor-containing resin sheet, the content of the phosphor is 250 to 1,000 parts by mass with respect to 100 parts by mass of the resin. By controlling the content of the phosphor in the phosphor-containing resin sheet to be in this range, the light resistance of the sheet can be improved. When the content of the phosphor is 400 to 800 parts by mass with respect to 100 parts by mass of the resin, both satisfactory light resistance of the sheet and good dispersion of the phosphor in the resin can be attained, which is preferred.

By incorporating the metal oxide particles (I) having an average particle size of 10 to 200 nm, the phosphor-containing resin sheet of the present invention not only shows flexible physical properties but also has excellent processability and ease of handling, despite containing the phosphor at a high concentration. Further, according to a preferred embodiment of the present invention, the phosphor-containing resin sheet of the present invention also contains metal oxide particles (II) having an average particle size of 300 to 1,000 nm in the metal oxide particles. By this, even when the phosphor-containing resin sheet contains the phosphor at a high concentration, light absorption by the phosphor itself is inhibited, so that an LED light-emitting device having high brightness can be obtained.

In another preferred embodiment of the present invention, the phosphor-containing resin sheet further contains silicone fine particles, by which the dispersibility of the metal oxide particles and phosphor is improved. Consequently, the brightness is improved and the color temperature variation of emitted light is reduced. Further, by incorporating the silicone fine particles, even when the phosphor-containing resin sheet contains the phosphor at a high concentration, light absorption by the phosphor itself is inhibited, so that an LED light-emitting device having high brightness can be provided.

The term "average particle size" used herein refers to an average value of the particle size determined by the following method. From a two-dimensional image obtained by observing the subject particles under a scanning electron microscope (SEM), the maximum distance between two points at which a straight line intersects with the circumference of a particle is measured and defined as the size of the particle. This measurement is carried out for 200 observed particles, and an average of the thus obtained particle size values is defined as the average particle size. When the size of the above-described metal oxide particles contained in the phosphor-containing resin sheet is measured, after grinding the phosphor-containing resin sheet by a method selected from mechanical grinding, microtomy, a CP (cross-section polisher) method and focused ion beam (FIB) processing such that its cross section can be observed, the resulting cross section is observed under a scanning electron microscope (SEM). Then, from a two-dimensional image obtained by the observation, the average particle size can be calculated in the same manner as described above.

As for the metal oxide particles (I), the metal oxide particles (I) having an average particle size of 10 nm or larger can be easily obtained. Not only that, since re-aggregation of such metal oxide particles (I) is not likely to occur, even when the phosphor is contained at a high concentration, the phosphor-containing resin sheet can sufficiently attain an effect of having flexible physical properties as well as excellent processability and ease of handling. Further, when the average particle size is 200 nm or smaller, the phosphor-containing resin sheet can be adjusted to have an appropriate flexibility by the interaction between the metal oxide particles (I) and the phosphor, so that the processability and the ease of handling of the phosphor-containing resin sheet are improved. Consequently, an LED light-emitting element using such a phosphor-containing resin sheet shows good optical properties. The average particle size of the metal oxide particles (I) is in a range of more preferably 10 to 100 nm, still more preferably 10 to 50 nm, particularly preferably 10 to 30 nm. This is because, by incorporating such metal oxide having an average particle size in this range, the interaction between the metal oxide and the phosphor is enhanced, allowing the phosphor-containing resin sheet to have satisfactory flexibility and dispersion stability at the same time.

Among the metal oxides contained in the phosphor-containing resin sheet of the present invention, examples of the metal oxide particles (I) include particles of silica, alumina, titania, zirconia, yttria, ceria, magnesia, zinc oxide, manganese oxide, copper oxide, iron oxide, holmium oxide, lead oxide and tin oxide, among which alumina is particularly preferred because it can be easily dispersed in the sheet. Further, particles of plural kinds of these metal oxides may be used in combination. The lower limit of the content of the metal oxide particles (I) in the phosphor-containing resin sheet of the present invention is preferably not less than 1 part by mass, more preferably not less than 3 parts by mass, with respect to 100 parts by mass of the resin. Further, the upper limit of the content is preferably 30 parts by mass or less, more preferably 20 parts by mass or less. By controlling the content of the metal oxide particles (I) to be not less than 1 part by mass, the post-curing tensile elongation at break of the phosphor-containing resin sheet is further improved, making the sheet unlikely to be cracked. Meanwhile, when the content of the metal oxide particles (I) is 30 parts by mass or less, the viscosity of the phosphor-containing resin composition does not become excessively high.

In the present invention, in order to improve the brightness, it is preferred that the phosphor-containing resin sheet further contain metal oxide particles (II) having an average particle size of 300 to 1,000 nm. This is because it is believed that absorption of light by the phosphor itself is inhibited by incorporating such metal oxide particles having a size in this range. When the concentration of the phosphor is high in the phosphor-containing resin sheet, the volume occupied by the phosphor in the sheet is increased; therefore, the pathway of light is markedly reduced and the probability of light being absorbed by the phosphor is thus increased, which may consequently reduce the brightness. However, in the phosphor-containing resin sheet of the present invention, by allowing the metal oxide particles (II) to exist within the phosphor filled in the sheet at a high density, light can be efficiently extracted to the outside. Particularly, when the average particle size of the metal oxide particles (II) is 300 to 1,000 nm, since light can be scattered and efficiently extracted to the outside, the brightness is thought to be consequently improved.

For the above reasons, the upper limit of the average particle size of the metal oxide particles (II) is preferably 1,000 nm or smaller, more preferably 800 nm or smaller. Further, the lower limit of the average particle size is preferably 300 nm or larger, more preferably 400 nm or larger. When the average particle size of the metal oxide particles (II) is larger than 1,000 nm, the particles themselves reflect and absorb light, which leads to a reduction in the brightness. Meanwhile, when the average particle size of the metal oxide particles (II) is smaller than 300 nm, light transmits through the sheet without being scattered.

The difference in refractive index between the metal oxide particles (II) and the below-described resin used in the phosphor-containing resin sheet is preferably 0.06 or greater. Since this is set for the purpose of causing scattering of light, the upper limit of the difference in refractive index between the metal oxide particles (II) and the resin is not particularly restricted; however, it is preferably 0.30 or less. By controlling the refractive index of the metal oxide particles (II) to be in the above-described range, scattering of light can be facilitated and the brightness can thereby be further improved.

The lower limit of the content of the metal oxide particles (II) in the phosphor-containing resin sheet of the present invention is preferably not less than 0.1 parts by mass, more preferably not less than 0.5 parts by mass, still more preferably not less than 1 part by mass, with respect to 100 parts by mass of the phosphor. Meanwhile, the upper limit of the content is preferably 20 parts by mass or less, more preferably 10 parts by mass or less, still more preferably 5 parts by mass or less. By controlling the content of the metal oxide particles (II) to be not less than 0.1 parts by mass, the light extraction efficiency can be improved. Further, when the content of the metal oxide particles (II) is 20 parts by mass or less, the metal oxide particles (II) do not affect the physical properties of the phosphor-containing resin sheet.

Examples of the metal oxide particles (II) contained in the phosphor-containing resin sheet of the present invention include particles of silica, alumina, titania, zirconia, yttria, ceria, magnesia, zinc oxide, manganese oxide, copper oxide, iron oxide, holmium oxide, lead oxide and tin oxide, among which alumina is particularly preferred because it can be easily dispersed in the sheet. Further, particles of plural kinds of these metal oxides may also be used in combination.

The silicone fine particles contained in the phosphor-containing resin sheet of the present invention are preferably fine particles selected from those of silicone resins and silicone rubbers. A silicone resin and a silicone rubber may also be used in combination. Particularly, silicone fine particles obtained by a method of hydrolyzing an organosilane, such as organotrialkoxysilane, organodialkoxysilane, organotriacetoxysilane, organodiacetoxysilane, organotrioximesilane or organodioximesilane, and then condensing the resultant are preferred.

Examples of the organotrialkoxysilane include methyltrimethoxysilane, methyltriethoxysilane, methyltri-n-propoxysilane, methyltri-i-propoxysilane, methyltri-n-butoxysilane, methyltri-i-butoxysilane, methyltri-s-butoxysilane, methyltri-t-butoxysilane, ethyltrimethoxysilane, n-propyltrimethoxysilane, propyltrimethoxysi lane, n-butyltributoxysilane, i-butyltributoxysilane, s-butyltributoxysilane, t-butyltributoxysilane, N-β(aminoethyl)γ-aminopropyltrimethoxysilane, γ-glycidoxypropyltrimethoxysilane, vinyltrimethoxysilane and phenyltrimethoxysilane.

Examples of the organodialkoxysilane include dimethyldimethoxysilane, dimethyldiethoxysilane, methylethyldimethoxysilane, methylethyldiethoxysilane, diethyldiethoxysilane, diethyldimethoxysilane, 3-aminopropylmethyldiethoxysilane, N-(2-aminoethyl)-3-aminopropylmethyldimethoxysilane, N-(2-aminoethyl)-3-aminoisobutylmethyldimethoxysilane, N-ethylaminoisobutylmethyldiethoxysilane, (phenylaminomethyl)methyldimethoxysilane and vinylmethyldiethoxysilane.

Examples of the organotriacetoxysilane include methyltriacetoxysilane, ethyltriacetoxysilane and vinyltriacetoxysilane.

Examples of the organodiacetoxysilane include dimethyldiacetoxysilane, methylethyldiacetoxysilane, vinylmethyldiacetoxysilane and vinylethyldiacetoxysi lane.

Examples of the organotrioximesilane include methyltrismethylethylketoximesilane and vinyltrismethylethylketoximesilane. Examples of the organodioximesilane include methylethylbismethylethylketoximesilane.

These particles can be obtained by, specifically, the method reported in JP-A No. S63-77940, the method reported in JP-A No. H6-248081, the method reported in JP-A No. 2003-342370, the method reported in JP-A No. H4-88022, or the like. In addition, there are also known, for example, a method of obtaining particles by adding an organosilane, such as organotrialkoxysilane, organodialkoxysilane, organotriacetoxysilane, organodiacetoxysilane, organotrioximesilane or organodioximesilane, and/or a partial hydrolysate thereof to an aqueous alkali solution and then hydrolyzing and condensing the organosilane and/or the partial hydrolysate; a method of obtaining particles by adding an organosilane and/or a partial hydrolysate thereof to water or an acidic solution, hydrolyzing the organosilane and/or the partial hydrolysate to obtain a partial condensate, and then adding an alkali thereto to allow condensation reaction to proceed; and a method of obtaining particles by arranging an organosilane and/or a hydrolysate thereof as an upper layer and an alkali or a mixture of an alkali and an organic solvent as a lower layer, and then allowing the organosilane and/or hydrolysate thereof to undergo hydrolysis and polycondensation at the interface between these layers. The particles used in the present invention can be obtained by any of these methods.

In these methods, in cases where spherical organopolysilsesquioxane fine particles are produced by hydrolysis and condensation of an organosilane and/or a partial hydrolysate thereof, it is preferred to adopt a means for adding a polymeric dispersant to a reaction solution as reported in JP-A No. 2003-342370.

Further, the silicone fine particles can also be produced by the following method. First, an organosilane and/or a partial hydrolysate thereof is hydrolyzed and condensed. In the presence of a polymeric dispersant and a salt, which function as protective colloid in a solvent, the organosilane and/or hydrolysate thereof is added to an acidic aqueous solution so as to obtain a hydrolysate. Then, an alkali is added to the resulting reaction solution to allow condensation reaction to proceed, thereby obtaining silicone fine particles.

As the polymeric dispersant, any synthetic polymer or natural polymer can be used as long as it is a water-soluble polymer and functions as a protective colloid in a solvent, and specific examples such a polymeric dispersant include polyvinyl alcohols and polyvinylpyrrolidones. Examples of a method of adding the polymeric dispersant include a method of adding the polymeric dispersant to an initial reaction solution in advance; a method of adding the polymeric dispersant simultaneously with an organotrialkoxysilane and/or a partial hydrolysate thereof; and a method of adding the polymeric dispersant after performing hydrolysis and partial condensation of an organotrialkoxysilane and/or a partial hydrolysate thereof, and any of these methods can be selected. Here, the amount of the polymeric dispersant to be added is preferably in a range of $5\times10^{-7}$ to $10^{-2}$ parts by mass with respect to 1 part by mass of the reaction solution. When the amount of the polymeric dispersant is within this range, aggregation of the particles is not likely to occur.

As an organic substituent(s) contained in the silicone fine particles, a methyl group and a phenyl group are preferred, and the refractive index of the silicone fine particles can be adjusted by changing the content of these substituents.

The lower limit of the content of the silicone fine particles in the phosphor-containing resin sheet of the present invention is preferably not less than 5 parts by mass, more preferably not less than 10 parts by mass, with respect to 100 parts by mass of the silicone resin. Further, the upper limit of the content is preferably 50 parts by mass or less, more preferably 30 parts by mass or less. By incorporating the silicone fine particles in an amount of not less than 5 parts by mass, particularly good effect of stabilizing the dispersion of the phosphor can be attained. Meanwhile, when the content of the silicone fine particles is 50 parts by mass or less, the viscosity of the phosphor-containing resin composition does not become excessively high.

Next, the mechanism by which absorption of light by the phosphor is suppressed in the phosphor-containing resin sheet of the present invention will be described. When the concentration of the phosphor is high in the phosphor-containing resin sheet, the volume occupied by the phosphor in the sheet is increased. This markedly reduces the pathway of light, and the probability of light being absorbed by the phosphor is thus increased. Consequently, the brightness is normally reduced. However, in the phosphor-containing resin sheet of the present invention, by allowing the silicone fine particles to exist within the phosphor filled in the sheet at a high density, light can be efficiently extracted to the outside. Particularly, when the average particle size of the silicone fine particles is 0.1 to 2 μm, since light can be scattered and efficiently extracted to the outside, the brightness is thought to be consequently improved.

For the above reasons, the upper limit of the average particle size of the silicone fine particles is preferably 2 μm or smaller, more preferably 1.5 μm or smaller. Meanwhile, the lower limit of the average particle size is more preferably 0.5 μm or larger.

Further, when average particle size is 0.1 μm or larger and 2.0 μm or smaller, the phosphor and the metal oxides can be uniformly dispersed in the sheet, so that color temperature variation of the sheet can be reduced. It is also preferred to use monodispersed true-spherical particles.

The average particle size of the silicone fine particles is determined by observation of a cross section of the sheet under an SEM and subsequent measurement, which are carried out in the same manner as in the above-described case of the metal oxide particles.

With regard to the tensile elastic modulus of the phosphor-containing resin sheet of the present invention, which is determined in accordance with JIS-K7161 (1994), the upper limit is preferably 1,000 MPa or less, more preferably 800 MPa or less. Meanwhile, the lower limit is preferably not less than 300 MPa, more preferably not less than 500 MPa. Further, with regard to the tensile elongation at break which is also determined in accordance with JIS-K7161 (1994), the upper limit is preferably 30% or less, more preferably 25% or less, still more preferably 20% or less, while the lower limit is preferably not less than 5%, more preferably not less than 7%, still more preferably not less than 10%. When the tensile elastic modulus and the tensile elongation at break are in the above-described respective ranges, the sheet can exhibit superior processability and ease of handling while maintaining its shape. The tensile elastic modulus and tensile elongation at break of the phosphor-containing resin sheet can be controlled by adjusting the heating condition in the production of the sheet. The tensile elastic modulus and the tensile elongation at break are closely related to the processability and ease of handling of the sheet.

As for the thickness of the phosphor-containing resin sheet of the present invention, from the standpoints of reducing thickness variation and improving the heat resistance, the upper limit of the thickness is preferably 150 μm or less, more preferably 100 μm or less. Meanwhile, the lower limit of the thickness is preferably not less than 20 μm, more preferably not less than 30 μm, still more preferably not less than 50 μm. These upper and lower limit values of the thickness of the phosphor-containing resin sheet can be applied in combination as appropriate.

In the present invention, the thickness of the phosphor-containing resin sheet refers to a thickness (average thickness) measured in accordance with JIS K7130 (1999) "Plastics—Film and sheeting—Determination of thickness by mechanical scanning (A)".

LEDs are in an environment where a large amount of heat is generated in a small space, and heat generation is notable particularly in high-power LEDs. Such heat generation increases the temperature of the phosphor and this consequently reduces the brightness of LED. Therefore, it is critical to dissipate the generated heat as efficiently as possible. In the present invention, by controlling the thickness of the phosphor-containing resin sheet to be in the above-described range, a phosphor-containing resin sheet having superior heat resistance can be obtained. Further, thickness variation of the phosphor-containing resin sheet leads to differences in the amount of the phosphor from one LED light-emitting element to another, and this consequently causes variations in the color temperature of emitted light. Therefore, by controlling the thickness of the phosphor-containing resin sheet to be in the above-described range, an LED having small variations in the color temperature of emitted light can be obtained. The thickness variation of the phosphor-containing resin sheet is preferably within a range of ±5%, more preferably within a range of ±3%. Here, the "thickness variation" is determined by measurement of the thickness in accordance with JIS K7130 (1999) "Plastics—Film and sheeting—Determination of thickness by mechanical scanning (A)" and subsequent calculation using the equation described below.

Specifically, under the measurement conditions prescribed by "Determination of thickness by mechanical scanning (A)", the thickness is measured using a commercially available micrometer such as a contact-type thickness meter, and the difference between the maximum or minimum value of the thus measured thickness and the average thickness is calculated. A value which is obtained by dividing the thus calculated value by the average thickness and expressed in percentage is defined as the thickness variation B (%).

Thickness variation $B$ (%)=(Maximum thickness deviation value*−Average thickness)/Average thickness×100

*As the maximum thickness deviation value, a larger value of the difference between the maximum thickness value and the average thickness and the difference between the minimum thickness value and the average thickness is selected.

As the phosphor contained in the phosphor-containing resin sheet of the present invention, any phosphor can be used as long as it absorbs light emitted from an LED light-emitting element, coverts its wavelength and emits light having a wavelength different from that of the light emitted by the LED light-emitting element. By this, a part of the light emitted from the LED light-emitting element and a part of the light emitted from the phosphor are mixed with each other, so that an LED which emits light of various colors including white light is obtained. More specifically, by optically combining a blue LED with a phosphor that is made to emit yellow light by the light emitted from the LED, a single LED chip can be used to emit white light.

Examples of the above-described phosphor include a variety of phosphors such as those that emits green light, those that emit blue light, those that emit yellow light and those that emit red light. Specific examples of the phosphor used in the present invention include known phosphors, such as inorganic phosphors, organic phosphors, fluorescent pigments and fluorescent dyes. Examples of the organic phosphors include allylsulfoamide-melamineformaldehyde cocondensation dyes and perylene-based fluorescent dyes, among which a perylene-based fluorescent dye is preferably used because it can be used for an extended period of time. Examples of a fluorescent substance particularly preferably used in the present invention include inorganic phosphors. The inorganic phosphor used in the present invention will now be described.

Examples of a green light-emitting phosphor include $SrAl_2O_4$:Eu, $Y_2SiO_5$:Ce,Tb, $MgAl_{11}O_{19}$:Ce,Tb, $Sr_7Al_{12}O_{25}$:Eu and (at least one of Mg, Ca, Sr and Ba)$Ga_2S_4$:Eu.

Examples of a blue light-emitting phosphor include $Sr_5(PO_4)_3Cl$:Eu, $(SrCaBa)_5(PO_4)_3Cl$:Eu, $(BaCa)_5(PO_4)_3Cl$:Eu, (at least one of Mg, Ca, Sr and Ba)$_2B_5O_9Cl$:Eu,Mn, and (at least one of Mg, Ca, Sr and Ba)$(PO_4)_6Cl_2$:Eu,Mn.

Examples of a green-to-yellow light-emitting phosphor include an yttrium-aluminum oxide phosphor activated with at least cerium; an yttrium-gadolinium-aluminum oxide phosphor activated with at least cerium; an yttrium-aluminum-garnet oxide phosphor activated with at least cerium; and an yttrium-gallium-aluminum oxide phosphor activated with at least cerium (so-called YAG phosphor). Specifically, $Ln_3M_5O_{12}$:R (wherein, Ln is at least one selected from Y, Gd and La; M includes at least either Al or Ca; and R is a lanthanoid-based material) and $(Y_{1-x}Ga_x)_3(Al_{1-y}Ga_y)_5O_{12}$:R (wherein, R is at least one selected from Ce, Tb, Pr, Sm, Eu, Dy and Ho; and 0<x<0.5, 0<y<0.5) can be used.

Examples of a red light-emitting phosphor include $Y_2O_2S$:Eu, $La_2O_2S$:Eu, $Y_2O_3$:Eu, and $Gd_2O_2S$:Eu.

Further, examples of a phosphor that emits light in response to a blue LED mainly used at present include YAG-based phosphors such as $Y_3(Al,Ga)_5O_{12}$:Ce, $(Y,Gd)_3Al_5O_{12}$:Ce, $Lu_3Al_5O_{12}$:Ce, and $Y_3Al_5O_{12}$:Ce; TAG-based phosphors such as $Tb_3Al_5O_{12}$:Ce; silicate-based phosphors such as $(Ba,Sr)_2SiO_4$:Eu phosphor, $Ca_3Sc_2Si_3O_{12}$:Ce phosphor and $(Sr,Ba,Mg)_2Sia_4$:Eu; nitride-based phosphors such as $(Ca,Sr)_2Si_5N_8$:Eu, $(Ca,Sr)AlSiN_3$:Eu and $CaSiAlN_3$:Eu; oxynitride-based phosphors such as $Ca_x(Si,Al)_{12}(O,N)_{16}$:Eu; and other phosphors such as $(Ba,Sr,Ca)Si_2O_2N_2$:Eu, $Ca_8MgSi_4O_{16}Cl_2$:Eu, and $SrAl_2O_4$:Eu,$Sr_4Al_{14}O_{25}$:Eu.

Among these phosphors, YAG-based phosphors, TAG-based phosphors and silicate-based phosphors are preferably used because of their light emitting efficiency, brightness and the like. Further, in addition to the above-described phosphors, known phosphors can also be used in accordance with the intended use and the desired emission color.

The particle size of the phosphor is not particularly restricted; however, the value of D50 is preferably not smaller than 0.05 μm, more preferably not smaller than 3 μm. Further, the value of D50 is preferably 30 μm or smaller, more preferably 20 μm or smaller. The term "D50" refers to a particle size at which, in a volume-based particle size distribution obtained by laser diffraction-scattering particle size distribution measurement, the cumulative particle size from the smaller side is 50%. When the D50 is in the above-described range, good dispersion of the phosphor in the sheet and, hence, stable light emission can be attained.

The resin used in the phosphor-containing resin sheet of the present invention is a resin capable of containing a phosphor therein, preferably a resin from which a sheet can be eventually formed. Thus, any resin can be used as long as it allows a phosphor to be uniformly dispersed therein and is capable of forming a sheet. Specific examples of such a resin include silicone resins, epoxy resins, polyallylate resins, PET-modified polyallylate resins, polycarbonate resins, cyclic olefins, polyethylene terephthalate resins, polymethylmethacrylate resins, polypropylene resins, modified acryls, polystyrene resins, and acrylonitrile-styrene copolymer resins. In the present invention, from the standpoint of the transparency, a silicone resin or an epoxy resin is preferably used. Further, from the standpoint of the heat resistance, a silicone resin is particularly preferably used.

As a silicone resin that can be used in the present invention, a curable silicone rubber is preferred. The silicone resin may be used in any of one-component liquid form and two-component (three-component) liquid form. In curable silicone rubbers, there are types in which a condensation reaction is induced by moisture in the air or a catalyst, such as dealcoholization type, deoximation type, acetic acid elimination type and dehydroxylamination type. Further, examples of a type in which a hydrosilylation reaction is induced by a catalyst include an addition reaction type. A curable silicone rubber of any of these types may be used. Particularly, an addition reaction-type silicone rubber is more preferred because it does not generate any by-product in association with curing reaction and shows small shrinkage on curing as well as because curing thereof can be easily accelerated by heating.

An addition reaction-type silicone rubber can be obtained by, for example, cross-linking a compound containing an alkenyl group bound to a silicon atom with a compound containing a hydrogen atom directly bound to a silicon atom by a hydrosilylation reaction. The compound containing an alkenyl group bound to a silicon atom is preferably a silicone compound having two or more alkenyl groups. Specific examples thereof include organopolysiloxanes having an alkenyl group(s); organopolysilsesquioxanes having an alkenyl group(s); organopolysiloxane-polysilsesquioxane copolymers having an alkenyl group(s); and organopolysiloxanes having a resin structure.

The alkenyl group is preferably an alkenyl group having 2 to 10 carbon atoms, and examples thereof include a vinyl group, an allyl group, a butenyl group, a hexenyl group and a decenyl group, among which a vinyl group is preferred because of its reactivity, ease of production and the like. Examples of such a compound include polyvinylmethylsiloxanes, and polyvinylmethylsiloxane-polydimethylsiloxane copolymers.

Examples of the compound containing a hydrogen atom directly bound to a silicon atom include polymethylhydrogensiloxanes, polydimethylsiloxane-polymethylhydrogensiloxane copolymers, polyethylhydrogensiloxanes, and polymethylhydrogensiloxane-polymethylphenylsiloxane copolymers. In addition, for example, known compounds such as those described in JP-A No. 2010-159411 can also be utilized.

Further, as a commercially available silicone resin, a silicone sealant for general LED applications can also be used. Specific examples thereof include OE-6630A/B and OE-6336A/B, which are manufactured by Dow Corning Toray Co., Ltd.; and SCR-1012A/B and SCR-1016A/B, which are manufactured by Shin-Etsu Chemical Co., Ltd.

An example of the method of preparing the phosphor-containing resin sheet of the present invention will now be described. First, as a coating solution for preparation of a phosphor layer, a solution in which a phosphor, the above-described metal oxide particles are mixed with and dispersed in a resin (hereinafter, referred to as "phosphor-dispersed resin composition") is prepared. The phosphor-dispersed resin composition can be obtained by adding and mixing a phosphor, metal oxide particles, a resin and, as required, an appropriate solvent. In cases where an addition reaction-type silicone resin is used, mixing of a compound containing an alkenyl group bound to a silicon atom with a compound containing a hydrogen atom bound to a silicon atom may initiate a rapid curing reaction even at room temperature. Thus, it is possible to extend the pot life by incorporating a hydrosilylation retarder, such as an acetylene compound, into the phosphor-dispersed resin composition. Further, as additives other than the above-described metal oxide particles, for example, a dispersant and/or a leveling agent for coating film stabilization and/or an adhesion aid such as a silane-coupling agent used as a sheet surface modifier can also be incorporated into the phosphor-dispersed resin composition. Moreover, as a phosphor precipitation inhibitor or an additive for improvement of the optical properties, for example, inorganic fine particles and/or silicone fine particles can be mixed in the mixing step for the production of the phosphor-dispersed resin composition used for preparation of a phosphor layer.

In order to allow the phosphor-dispersed resin composition to have an appropriate fluidity, a solvent can be added as well. The solvent is not particularly restricted as long as it is capable of adjusting the viscosity of a resin in a fluid state. Examples of such a solvent include toluene, methyl ethyl ketone, methyl isobutyl ketone, hexane, acetone, terpineol, texanol, methyl cellosolve, butylcarbitol and butylcarbitol acetate. Further, as additives, for example, a dispersant and/or a leveling agent for coating film stabilization and/or an adhesion aid such as a silane-coupling agent used as a sheet surface modifier can also be added.

After mixing these components in accordance with a prescribed composition, the resultant is uniformly mixed and dispersed using a stirrer or a kneader, such as a homogenizer, a rotation-revolution stirrer, a three-roll mill, a ball mill, a planetary ball mill or a bead mill, thereby a phosphor-dispersed resin composition is obtained. After the mixing or in the mixing process, defoaming is also preferably performed in vacuum or under reduced pressure. By the above-described steps, a phosphor-dispersed resin composition can be produced.

Next, the phosphor-dispersed resin composition is coated on a base material and dried. This coating can be performed using a reverse roll coater, a blade coater, a slit die coater, a direct gravure coater, an offset gravure coater, a kiss coater, a natural roll coater, an air knife coater, a roll blade coater, a baribar roll blade coater, a two-stream coater, a rod coater, a wire bar coater, an applicator, a dip coater, a curtain coater, a spin coater, a knife coater or the like. In order to attain uniformity in the thickness of the resulting phosphor-containing resin sheet, it is preferred that the phosphor-dispersed resin composition be coated using a slit die coater.

The sheet can be dried using an ordinary heating apparatus such as a hot air drier or an infrared drier. An ordinary heating apparatus such as a hot air drier or an infrared drier is also used for heating the sheet. In this case, the heating is performed usually at 40 to 250° C. for 1 minute to 5 hours, preferably at 100° C. to 200° C. for 2 minutes to 3 hours.

The base material is not particularly restricted, and any known base material such as a metal, a film, a glass, a ceramic or a paper can be used. Specific examples of the base material include plates and foils of metals such as aluminum (including aluminum alloy), zinc, copper and iron; films made of plastics such as cellulose acetate, polyethylene terephthalate (PET), polyethylene, polyester, polyamide, polyimide, polyphenylene sulfide, polystyrene, polypropylene, polycarbonate, polyvinyl acetate, aramid, silicone and polyolefin; papers on which the above-described plastics are laminated; papers coated with the above-described plastics; papers on which the above-described metals are laminated or vapor-deposited; and plastic films on which the above-described metals are laminated or vapor-deposited. In cases where the base material is a metal plate, the surface thereof may be subjected to a plating treatment with chromium, nickel or the like, or a ceramic treatment. Among the above-described materials, from the standpoint of adhesion between the phosphor-containing resin sheet and an LED light-emitting element, the base material is preferably in the form of a flexible film. Further, it is preferred that the film-form base material have high strength so as to avoid potential breakage or the like during handling. From the standpoints of these required characteristics and economic efficiency, resin films are preferred and, thereamong, PET films are more preferred because of their economic efficiency and ease of handling. In cases where a high temperature of 200° C. or higher is required for curing the resin or pasting the phosphor-containing resin sheet to an LED, a polyimide film is preferred because of its heat resistance. For easier detachment of the sheet, the surface of the base material may also be subjected to a mold-release treatment in advance.

The thickness of the base material is not particularly restricted; however, the lower limit of the thickness is preferably not less than 25 µm, more preferably not less than 38 µm. Further, the upper limit of the thickness is preferably 5,000 µm or less, more preferably 3,000 µm or less.

A method of cutting the phosphor-containing resin sheet of the present invention and pasting it to an LED light-emitting element and a method of producing a light-emitting device using the resultant will now be described.

Examples of the method of cutting the phosphor-containing resin sheet of the present invention include a method in which the phosphor-containing resin sheet is cut into pieces in advance and then pasted to individual LED light-emitting elements; and a method in which the phosphor-containing resin sheet is pasted to a wafer-level LED light-emitting element and then cut in a lump simultaneously with dicing of the resulting wafer.

In cases where the method in which the phosphor-containing resin sheet is cut into pieces in advance and then pasted to individual LED light-emitting elements is employed, the phosphor-containing resin sheet may be processed into a prescribed shape and divided in advance by laser processing or cutting with a cutting tool. In laser processing, it is very difficult to avoid burning of the resin and degradation of the phosphor; therefore, it is desired that the phosphor-containing resin sheet be processed by cutting with a cutting tool. Examples of a method of cutting the phosphor-containing resin sheet with a cutting tool include a method of cutting by simply pressing a blade and a method of cutting with a rotary blade, and either of these methods can be suitably employed. As an apparatus which performs cutting with a rotary blade, an apparatus called "dicer", which is used for cutting (dicing) a semiconductor substrate into separate chips, can be suitably utilized. When a dicer is used, the width of the dividing line can be precisely controlled by adjusting the thickness of the rotary blade and the condition settings; therefore, a higher processing accuracy can be attained than a case where cutting is performed by simple pressing of a blade.

When the phosphor-containing resin sheet of the present invention is cut, the phosphor-containing resin sheet may be cut into pieces together with the base material. The phosphor-containing resin sheet may also be cut into pieces without the base material being cut. Also, when the phosphor-containing resin sheet is cut into piece, a groove may be formed to a desired depth on the base material simultaneously with the cutting of the phosphor-containing resin sheet. The resulting pieces of the phosphor-containing resin sheet obtained by dividing the sheet into plural sections in this manner are detached one by one from the base material and pasted onto individual LED light-emitting elements; therefore, it is preferred that the phosphor-containing resin sheet cut into plural pieces be immobilized on one sheet of base material. Accordingly, the phosphor-containing resin sheet which is cut into pieces without its base material being cut and the phosphor-containing resin sheet which is cut into pieces with a groove being formed to a desired depth on the base material are preferred because they have excellent positional accuracy and ease of handling. The phosphor-containing resin sheet may assume an arbitrary shape such as a circular, square, rectangular or triangular shape. Further, the phosphor-containing resin sheet preferably has a size of 5 to 20 cm in terms of diameter when it is circular or in terms of length of one side when it is polygonal, because the phosphor-containing resin sheet of such a size has good ease of handling. Moreover, the size of each section of the phosphor layer divided into the phosphor-containing resin sheet of the above-described size is preferably 0.1 to 10 mm-square, which is equal to the size of an LED light-emitting element.

It is also possible to paste the phosphor-containing resin sheet in a lump onto before dicing a wafer-level LED light-emitting element and then cut the phosphor-containing resin sheet simultaneously with the dicing of the LED light-emitting element wafer. In this case, an adhesive layer may be applied to the LED light-emitting element wafer to paste the phosphor-containing resin sheet of the present invention thereon, or the phosphor-containing resin sheet may be directly pasted onto the LED light-emitting element wafer without such an adhesive layer by using a heat-adhesive resin. In cases where the wafer and the phosphor-containing resin sheet are diced together, the cycle time of dicing is shortened when an adhesive layer is not used; therefore, it is preferred that the phosphor-containing resin sheet be directly pasted to the wafer without an adhesive layer. Generally, since a wafer is diced using the above-described dicer and the conditions thereof such as the blade rotation speed in cutting and the cutting rate are optimized for cutting the wafer, it is difficult to set the conditions optimal for cutting the phosphor-containing resin sheet together with the wafer. However, by using the phosphor-containing resin sheet having a high elastic modulus, the conditions can be easily optimized and the cutting can thus be suitably performed.

In cases where the phosphor-containing resin sheet of the present invention is pasted to an LED light-emitting element having an electrode on the upper surface, it is desired that, before pasting the phosphor-containing resin sheet, a hole be made on the part thereof corresponding to the electrode. For this hole making process, a known method such as laser processing or mold punching can be suitably employed; however, punching with a mold is more desirable because laser processing causes burning of the resin and degradation of the phosphor. In cases where punching is performed, the phosphor-containing resin sheet is subjected to the punching process before being pasted to an LED light-emitting element, because it is impossible to perform punching after the phosphor-containing resin sheet is pasted to the LED element. In punching with a mold, a hole of a desired shape and a desired size is made in accordance with the shape and the like of the electrode on the LED light-emitting element to which the phosphor-containing resin sheet is pasted. The size and the shape of the hole can be arbitrary selected; however, an electrode-connecting part on an LED element of 1 mm-square is in a size of preferably 500 μm or smaller so as not to reduce the area of the light-emitting surface. Thus, the hole is formed in a size of 500 μm or smaller in accordance with the size of the electrode-connecting part. Further, an electrode to be wire-bonded is required to have a certain size, which is at least about 50 μm. In this case, the size of the hole is also about 50 μm in accordance with the size of the electrode. When the size of the hole is excessively larger than that of the electrode, the light-emitting surface is exposed to cause leakage of light, which leads to deterioration of the color characteristics of an LED light-emitting device. Meanwhile, when the size of the hole is excessively smaller than that of the electrode, a wire comes into contact with the hole during wire bonding, which leads to defective connection. Therefore, in the hole making process, a small hole of not smaller than 50 μm and not larger than 500 μm in size is made with high precision of ±10%. In order to improve the punching precision, the mechanical and physical properties of the phosphor-containing resin sheet of the present invention should be taken into consideration.

By pasting the phosphor-containing resin sheet of the present invention to an LED light-emitting element having a common structure of, for example, a lateral, vertical or flip-chip LED, a laminate in which a phosphor layer is laminated on the surface of the LED light-emitting element can be obtained. The phosphor-containing resin sheet of the present invention can be particularly preferably used on a vertical or flip chip-type LED light-emitting element having a large light-emitting area. By directly coating the LED light-emitting element with the phosphor layer, the light emitted from the LED light-emitting element is allowed to directly enter the phosphor layer functioning as a wavelength conversion layer, without being lost due to reflection and the like. As a result, uniform white light having small color variation can be obtained with high efficiency. The term "wavelength conversion layer" used herein refers to a layer which absorbs light emitted from an LED light-emitting element, converts the wavelength of the light and releases light having a wavelength different from that of the light emitted from the LED light-emitting element. The laminate obtained by the above-described method can be subjected to metal wiring and sealing to be packaged and then integrated into a module, which is suitably used in a variety of light-emitting devices including lighting apparatuses, liquid-crystal backlights and spotlights.

EXAMPLES

The present invention will now be described more concretely by way of examples thereof, however, the present invention is not restricted thereto.

<Measurement of Elastic Modulus and Tensile Elongation at Break>

The tensile elastic modulus and the tensile elongation at break of a prepared phosphor-containing resin sheet were measured as follows. After the phosphor-containing resin sheets of the below-described Examples and Comparative Examples were each detached from the base material, the resulting film was cut with a razor to prepare 10 test pieces of 10 mm×60 mm in size (including 5-mm holding parts on both ends). Using, as a testing apparatus, Tensilon UTM-II-20 (manufactured by Toyo Baldwin Co., Ltd.) which is a tensile tester in accordance with JIS-B-7721 (2009), 5-mm parts on both ends of each test piece were attached to and immobilized by the chucks of the testing apparatus (chuck distance: 15 mm) and the test piece was subjected to a tensile test at a tensile rate of 50 mm/min (in an environment of 25° C. and 50% RH). The tensile elastic modulus was calculated in accordance with the method prescribed in JIS K7161 (1994) 4.6 Modulus of Elasticity in Tension. Specifically, the tensile elastic modulus was calculated as follows. First, the stress values at two strain points, $\epsilon_1$ (=0.0005) and $\epsilon_2$ (0.0025), were determined and defined as $\sigma_1$ and $\sigma_2$, respectively. Then, the tensile elastic modulus was determined as the value of $(\sigma_2-\sigma_1)/(\epsilon_2-\epsilon_1)$. When the test piece was broken without yield, the value of the tensile strain at break prescribed in JIS K7161 (1994) 4.4.2 was used as the tensile elongation at break. When the test piece was broken after yielding, the value of the nominal tensile strain at break prescribed in JIS K7161 (1994) 4.5.1 was used.

<Cutting Workability>

A phosphor-containing resin sheet on a base material was cut into 10,000 pieces of 1 mm square in size and, simultaneously with this cutting of the phosphor-containing resin sheet, a groove was formed on the base material. For the cutting, a cutting apparatus, GCUT manufactured by UHT Corporation, was used. Then, defects such as burrs on a cross-section of the sheet as well as chipping and cracking of the sheet were examined. From the 10,000 pieces obtained by cutting the sheet, 100 pieces were randomly selected, and the cutting workability was evaluated based on the number of the pieces showing good cutting condition.

<Color Temperature Variation>

An electric current of 20 mA was applied to a light-emitting device, in which a phosphor-containing resin sheet was mounted on a blue LED element, to light up an LED chip, and the correlated color temperature was measured using an array spectrometer (MCPD-3000, manufactured by Otsuka Electronics Co., Ltd.). Ten samples were prepared and the difference between the maximum and minimum values of the measured correlated color temperature (CCT) was defined as the color temperature variation.

<Measurement of Brightness>

An electric current of 20 mA was applied to a light-emitting device, in which a phosphor-containing resin sheet was mounted on a blue LED element, to light up an LED chip and, immediately after the start of the test, the correlated color temperature and the brightness were measured using an array spectrometer (MCPD-3000, manufactured by Otsuka Electronics Co., Ltd.).

<Light Resistance>

An electric current of 20 mA was applied to a light-emitting device, in which a phosphor-containing resin sheet was mounted on a blue LED element, to light up an LED chip and, immediately after the start of the test, the correlated color temperature and the brightness were measured using an array spectrometer (MCPD-3000, manufactured by Otsuka Electronics Co., Ltd.). Then, the light-emitting device was left to stand with the LED chip being lit and, after a lapse of 500 hours, the brightness was measured in the same manner and the brightness retention rate was calculated using the following equation to evaluate the light resistance. It is noted here that a higher brightness retention rate indicates superior light resistance. An evaluation of B or better means that the light resistance presents no practical problem, and an evaluation of A or better means that the light resistance is excellent in practical use.

Brightness retention rate (I) (%)=(Brightness after 500 hours/Brightness immediately after the start of the test)×100

(The first decimal point was rounded to the nearest whole number)

S: retention rate=95% or higher; very good light resistance
A: retention rate=90 to 94%; good light resistance
B: retention rate=80 to 89%; no practical problem in light resistance
C: retention rate=50 to 79%; poor light resistance
D: retention rate=49% or lower; markedly poor light resistance <Heat Resistance>

An electric current of 20 mA was applied to a light-emitting device, in which a phosphor-containing resin sheet was mounted on a blue LED element, to light up an LED chip and, immediately after the start of the test, the correlated color temperature and the brightness were measured using an array spectrometer (MCPD-3000, manufactured by Otsuka Electronics Co., Ltd.). Then, the LED chip was maintained at 170° C. and, after a lapse of 500 hours, the brightness was measured in the same manner and the brightness retention rate was calculated using the following equation to evaluate the heat resistance. It is noted here that a higher brightness retention rate indicates superior heat resistance. An evaluation of B or better means that the heat resistance presents no practical problem, and an evaluation of A or better means that the heat resistance is excellent in practical use.

Brightness retention rate ($II$) (%)=(Brightness after 500 hours/Brightness immediately after the start of the test)×100

(The first decimal point was rounded to the nearest whole number)

S: retention rate=90% or higher; very good heat resistance
A: retention rate=81 to 89%; good heat resistance
B: retention rate=50 to 80%; no practical problem in heat resistance
C: retention rate=49% or lower; poor heat resistance <Average Particle Size>

Using a scanning electron microscope 54800 (manufactured by Hitachi High-Technologies Corporation), particles were observed at an acceleration voltage of 5 kv, a focal distance of 8.0 mm and a measurement magnification of ×100,000. The diameter of a particle was defined as a diameter of circle which yields the same area. A total of 200 particles were observed and an average thereof was used.

The materials that were used will now be described.

<Silicone Resin>

Silicone resin 1: OE6630 (manufactured by Dow Corning Toray Co., Ltd), refractive index=1.53

<Metal Oxide Particles>

Metal oxide particle 1: alumina powder "TM-300" (manufactured by Taimei Chemicals Co., Ltd.), average particle size=7 nm, refractive index=1.76

Metal oxide particle 2: silica powder "Aerosil 200" (manufactured by Nippon Aerosil Co., Ltd.), average particle size=12 nm, refractive index=1.48

Metal oxide particle 3: alumina powder "Acroxide" (manufactured by Nippon Aerosil Co., Ltd.), average particle size=13 nm, refractive index=1.76

Metal oxide particle 4: alumina powder "Nanotek" (manufactured by C.I. Kasei Co., Ltd.), average particle size=30 nm, refractive index=1.76

Metal oxide particle 5: titania powder "Nanotek" (manufactured by C.I. Kasei Co., Ltd.), average particle size=36 nm, refractive index=2.62

Metal oxide particle 6: alumina powder "TM-DAR" (manufactured by Taimei Chemicals Co., Ltd.), average particle size=100 nm, refractive index=1.76

Metal oxide particle 7: alumina powder "AKP-50" (manufactured by Sumitomo Chemical Co., Ltd.), average particle size=200 nm, refractive index=1.76

Metal oxide particle 8: alumina powder "AKP-30" (manufactured by Sumitomo Chemical Co., Ltd.), average particle size=300 nm, refractive index=1.76

Metal oxide particle 9: alumina powder "AKP-20" (manufactured by Sumitomo Chemical Co., Ltd.), average particle size=500 nm, refractive index=1.76

Metal oxide particle 10: alumina powder "AO-802" (manufactured by Admatechs Co., Ltd.), average particle size=700 nm, refractive index=1.76

Metal oxide particle 11: alumina powder "ALO-13PB" (manufactured by Kojundo Chemical Laboratory Co., Ltd.), average particle size=1,000 nm, refractive index=1.76

Metal oxide particle 12: alumina powder "A-50-K" (manufactured by Showa Denko K.K.), average particle size=1,200 nm, refractive index=1.76

Silicone fine particles were synthetized by the following methods.

<Silicone Fine Particle 1>

A stirrer, a thermometer, a reflux tube and a dropping funnel were attached to a 2-L four-necked round-bottom flask and, as a surfactant, 2 L of 2.5% aqueous ammonia containing 1 ppm of polyether-modified siloxane "BYK333" (manufactured by BYK Japan K.K.) was added to the flask, which was then heated in an oil bath with stirring at 300 rpm. Once the inner temperature reached 50° C., 200 g of a mixture of methyltrimethoxysilane and phenyltrimethoxysilane (23/77 mol %) was added dropwise via the dropping funnel over a period of 30 minutes. After stirring the added materials at this temperature for another 60 minutes, about 5 g of acetic acid (reagent grade) was added, and the resultant was mixed by stirring and then filtered. To the thus produced particles on the filter, 600 mL of water was added twice and 200 mL of methanol was added once, followed by filtration and washing. The resulting cake on the filter was taken out, crushed and then freeze-dried for 10 hours to obtain 60 g of white powder. When the thus obtained particles were observed under an SEM (scanning electron microscope), they were found to be spherical fine particles having substantially the same diameter. As a result of observing these particles under a cross-sectional TEM (transmission electron microscope), it was confirmed that the particles had a single internal structure.

<Silicone Fine Particle 2>

A stirrer, a thermometer, a reflux tube and a dropping funnel were attached to a 2-L four-necked round-bottom flask and, as a surfactant, 2 L of 2.5% aqueous ammonia containing 7 ppm of polyether-modified siloxane "BYK333" (manufactured by BYK Japan K.K.) was added to the flask, which was then heated in an oil bath with stirring at 300 rpm. Once the inner temperature reached 50° C., 200 g of a mixture of methyltrimethoxysilane and phenyltrimethoxysilane (23/77 mol %) was added dropwise via the dropping funnel over a period of 30 minutes. After stirring the added materials at this temperature for another 60 minutes, about 5 g of acetic acid (reagent grade) was added, and the resultant was mixed by stirring and then filtered. To the thus produced particles on the filter, 600 mL of water was added twice and 200 mL of methanol was added once, followed by filtration and washing. The resulting cake on the filter was taken out, crushed and then freeze-dried for 10 hours to obtain 40 g of white powder.

When the thus obtained particles were observed under an SEM, they were found to be spherical fine particles having substantially the same diameter. As a result of observing these particles under a cross-sectional TEM, it was confirmed that the particles had a single internal structure.

<Silicone Fine Particle 3>

A stirrer, a thermometer, a reflux tube and a dropping funnel were attached to a 1-L four-necked round-bottom flask, and 600 g of aqueous caustic soda solution having a pH of 12.5 (25° C.) was added to the flask, which was then heated in an oil bath with stirring at 300 rpm. Once the inner temperature reached 50° C., 60 g of a mixture of methyltrimethoxysilane and phenyltrimethoxysilane (23/77 mol %) was added dropwise via the dropping funnel over a period of 20 minutes. After stirring the added materials at this temperature for another 30 minutes, 16.5 g of 10% aqueous acetic acid solution was added as a neutralizer, and the resultant was mixed by stirring and then filtered. To the thus produced particles on the filter, 300 mL of water was added three times and 200 mL of methanol was added once, followed by filtration and washing. The resulting cake on the filter was taken out and dried at 150° C. for 2 hours to obtain 15 g of white powder. When the thus obtained particles were observed under an SEM, they were found to be spherical fine particles having substantially the same diameter. As a result of observing these particles under a cross-sectional TEM, it was confirmed that the particles had a single internal structure.

<Silicone Fine Particle 4>

A stirrer, a thermometer, a reflux tube and a dropping funnel were attached to a 2-L four-necked round-bottom flask, and 2 L of 2.5% aqueous ammonia was added to the flask, which was then heated in an oil bath with stirring at 300 rpm. Once the inner temperature reached 50° C., 200 g of a mixture of methyltrimethoxysilane and phenyltrimethoxysilane (23/77 mol %) was added dropwise via the dropping funnel over a period of 30 minutes. After stirring the added materials at this temperature for another 60 minutes, about 5 g of acetic acid (reagent grade) was added, and the resultant was mixed by stirring and then filtered. To the thus produced particles on the filter, 600 mL of water was added twice and 200 mL of methanol was added once, followed by filtration and washing. The resulting cake on the filter was taken out, crushed and then freeze-dried for 10 hours to obtain 80 g of white powder. When the thus obtained particles were observed under an SEM, they were found to be spherical fine particles having substantially the same diameter. As a result of observing these particles under a cross-sectional TEM, it was confirmed that the particles had a single internal structure.

<Silicone Fine Particle 5>

A stirrer, a thermometer, a reflux tube and a dropping funnel were attached to a 1-L four-necked round-bottom flask, and 600 g of aqueous caustic soda solution having a pH of 12.5 (25° C.) was added to the flask, which was then heated in an oil bath with stirring at 280 rpm. Once the inner temperature reached 50° C., 60 g of a mixture of methyltrimethoxysilane and phenyltrimethoxysilane (23/77 mol %) was added dropwise via the dropping funnel over a period of 20 minutes. After stirring the added materials at this temperature for another 30 minutes, 16.5 g of 10% aqueous acetic acid solution was added as a neutralizer, and the resultant was mixed by stirring and then filtered. To the thus produced particles on the filter, 300 mL of water was added three times and 200 mL of methanol was added once, followed by filtration and washing. The resulting cake on the filter was taken out and dried at 150° C. for 2 hours to obtain 13 g of white powder. When the thus obtained particles were observed under an SEM, they were found to be spherical fine particles having substantially the same diameter. As a result of observing these particles under a cross-sectional TEM, it was confirmed that the particles had a single internal structure.

<Silicone Fine Particle 6>

A stirrer, a thermometer, a reflux tube and a dropping funnel were attached to a 1-L four-necked round-bottom flask, and 600 g of aqueous caustic soda solution having a pH of 12.5 (25° C.) was added to the flask, which was then heated in an oil bath with stirring at 200 rpm. Once the inner temperature reached 50° C., 60 g of a mixture of methyltrimethoxysilane and phenyltrimethoxysilane (23/77 mol %) was added dropwise via the dropping funnel over a period of 20 minutes. After stirring the added materials at this temperature for another 30 minutes, 16.5 g of 10% aqueous acetic acid solution was added as a neutralizer, and the resultant was mixed by stirring and then filtered. To the thus produced particles on the filter, 300 mL of water was added three times and 200 mL of methanol was added once, followed by filtration and washing. The resulting cake on the filter was taken out and dried at 150° C. for 2 hours to obtain 10 g of white powder. When the thus obtained particles were observed under an SEM, they were found to be spherical fine particles having substantially the same diameter. As a result of observing these particles under a cross-sectional TEM, it was confirmed that the particles had a single internal structure.

Production examples and evaluation results of phosphor sheets will now be described. The added amounts of the respective materials are shown in Tables below, and the unit "parts" used therein means "parts by mass".

Example 1

In a polyethylene container, 100 parts by mass of "OE-6630A/B" (manufactured by Dow Corning Toray Co., Ltd.), 600 parts by mass of "NYAG-02" (manufactured by Intematix Corporation: Ce-doped YAG-based phosphor, specific gravity: 4.8 g/cm$^3$) and 10 parts by mass of the metal oxide particle 3 were weighed as a silicone resin, phosphor and metal oxide particle (I), respectively.

Using a planetary stirring/defoaming machine "Mazerustar" (registered trademark) KK-400 (manufactured by Kurabo Industries, Ltd.), the thus weighed materials were stirred and defoamed at 1,000 rpm for 20 minutes. Then, the viscosity of the resultant was adjusted with a dilution solvent to obtain a solution for sheet preparation. This solution for sheet preparation was coated on a base material "Cerapeel" (registered trademark) BLK (manufactured by Toray Advanced Film Co., Ltd.) using a slit die coater and then heat-dried at 120° C. for 1.5 hours, thereby obtaining a phosphor-containing resin sheet having an average thickness of about 75 μm.

The thus obtained phosphor-containing resin sheet was subjected to a tensile test in the above-described manner to measure the tensile elastic modulus and the tensile elongation at break. The results thereof are shown in Table 1.

In the evaluation of the cutting workability performed by the above-described method, all of the 100 pieces of the sheet had good shape without any defect such as cracking.

Using a die bonding paste "EN-4900GC" (manufactured by Hitachi Chemical Co., Ltd.), the phosphor-containing resin sheet subjected to the above-described cutting process was pasted onto the surface of a 1 mm-square flip chip-type blue LED chip mounted on a substrate. The resulting chip was heated on a 100° C. hot plate for 1 minute to cure the die bonding paste, thereby obtaining a light-emitting device.

As a result of evaluating the brightness of the thus obtained light-emitting device by the above-described method, the brightness was found to be 1.505 cd/cm$^2$. The color temperature variation was evaluated to be small and good at 92K. Further, in the evaluation of the light resistance by the above-described method, the brightness retention rate (I) was found to be 95%, which presents no practical problem. Moreover, when the heat resistance was evaluated by the above-described method, the brightness retention rate (II) was found to be 83%, which is a favorable result.

(Examples 2 to 6)—Effects of Particle Size of Metal Oxide Particle (I)

The cutting workability, color temperature variation, brightness, light resistance and heat resistance were evaluated by performing the same operations as in Example 1, except that the kind of the metal oxide particle (I) was changed as shown in Table 1. As the average particle size of the metal oxide particle (I) was increased, the tensile elastic modulus tended to be higher and the tensile elongation at break tended to be smaller. Correspondingly, the color temperature variation also tended to be increased; however, these properties were all within a range of no practical problem in the respective Examples. In Examples 1 to 4, particularly preferred results were obtained. The cutting workability and the light resistance were both good in all of these Examples, and the results of the heat resistance were at a practically acceptable level or better. Particularly, good heat resistance was attained when alumina was used as the metal oxide particle (I).

(Examples 7 to 10)—Effects of Phosphor Content

The cutting workability, color temperature variation, brightness, light resistance and heat resistance were evaluated by performing the same operations as in Example 1, except that the content of the phosphor was changed as shown in Table 1. As the content of the phosphor was increased, the light resistance and the tensile elastic modulus tended to be higher and the tensile elongation at break tended to be smaller. Correspondingly, the color temperature variation also tended to be increased; however, these properties were all within a range of no practical problem in the respective Examples. On the other hand, as the content of the phosphor was reduced, the brightness retention rate (I) tended to be smaller; however, the light resistance was also within a range that presents no problem. The cutting workability and the heat resistance were both good.

(Examples 11 to 14)—Effects of Metal Oxide Particle (I) Content

The cutting workability, color temperature variation, brightness, light resistance and heat resistance were evaluated by performing the same operations as in Example 1, except that the content of the metal oxide particle (I) was changed as shown in Table 2. The cutting workability, color temperature variation and heat resistance were all within a range of no practical problem in these Examples. Particularly, in Examples 12 and 13 where the content of the metal oxide particle (I) was in a range of 3 parts by mass to 20 parts by mass, particularly preferred results were obtained. The light resistance was good in all of these Examples.

(Examples 15 to 18)—Effects of Sheet Thickness

The cutting workability, color temperature variation, brightness, light resistance and heat resistance were evaluated by performing the same operations as in Example 1, except that the thickness of the phosphor-containing resin sheet was changed as shown in Table 2. The cutting workability, color temperature variation and light resistance were all good in these Examples. As the sheet thickness was increased, the brightness retention rate (II), which is an index of heat resistance, tended to be smaller; however, the heat resistance was within a range of no practical problem in all of these Examples. Particularly, in Examples 15 to 17 where the sheet thickness was in a range of 20 μm to 100 μm, good heat resistance was attained.

Comparative Example 1

The cutting workability, color temperature variation, brightness, light resistance and heat resistance were evaluated by performing the same operations as in Example 1, except that the kind of the metal oxide particle (I) was changed as shown in Table 12. The phosphor-containing resin sheet was cut into pieces in the same manner as in Example 1; however, only 58 normal pieces were obtained and the remaining pieces of the phosphor-containing resin sheet were cracked. Cracking occurred also when the pieces of the phosphor-containing resin sheet were pasted to the blue LED, and the color temperature variation was found to be large at 243 K. It is noted here that the light resistance and heat resistance were evaluated for those samples that could be normally cut into pieces and pasted.

Comparative Example 2

The cutting workability, color temperature variation, brightness, light resistance and heat resistance were evaluated by performing the same operations as in Example 1, except that the kind of the metal oxide particle (I) was changed as shown in Table 12. The phosphor-containing resin sheet was cut into pieces in the same manner as in Example 1; however, only 43 normal pieces were obtained and the remaining pieces of the phosphor-containing resin sheet were cracked. Cracking occurred also when the pieces of the phosphor-containing resin sheet were pasted to the blue LED, and the color temperature variation was found to be large at 293 K. The light resistance and heat resistance were evaluated for those samples that could be normally cut into pieces and pasted.

Comparative Example 3

The cutting workability, color temperature variation, brightness, light resistance and heat resistance were evaluated by performing the same operations as in Example 1, except that the metal oxide particle (I) was not incorporated. The phosphor-containing resin sheet was cut into pieces in the same manner as in Example 1; however, only 45 normal pieces were obtained and the remaining pieces of the phosphor-containing resin sheet were cracked. Cracking occurred also when the pieces of the phosphor-containing resin sheet were pasted to the blue LED, and the color temperature variation was found to be large at 284 K. The light resistance and heat resistance were evaluated for those samples that could be normally cut into pieces and pasted.

Comparative Example 4

The cutting workability, color temperature variation, brightness, light resistance and heat resistance were evaluated by performing the same operations as in Example 1, except that the content of the phosphor was changed as shown in Table 12. The phosphor-containing resin sheet was cut into pieces in the same manner as in Example 1, and all of the resulting 100 pieces had no defect such as cracking and the color temperature variation was evaluated to be small and good at 95 K. However, the brightness retention rate (I) was poor at 62% and the light resistance was problematic.

Comparative Example 5

It was tried to prepare a phosphor-containing resin sheet in the same manner as in Example 1 except that the content of the phosphor was changed as shown in Table 12; however, the sheet could not be prepared due to gelation of the paste.

(Example 19)—Mixing of Two Kinds of Metal Oxide Particles

In a polyethylene container, 100 parts by mass of "OE-6630A/B" (manufactured by Dow Corning Toray Co., Ltd.), 600 parts by mass of "NYAG-02" (manufactured by Intematix Corporation: Ce-doped YAG-based phosphor, specific gravity: 4.8 g/cm$^3$), 10 parts by mass of the metal oxide particle 3 and 6 parts by mass of the metal oxide particle 9 were weighed as a silicone resin, phosphor, metal oxide particle (I) and oxide metal particle (II), respectively.

Using a planetary stirring/defoaming machine "Mazerustar" (registered trademark) KK-400 (manufactured by Kurabo Industries, Ltd.), the thus weighed materials were stirred and defoamed at 1,000 rpm for 20 minutes. Then, the viscosity of the resultant was adjusted with a dilution solvent to obtain a solution for sheet preparation. This solution for sheet preparation was coated on a base material "Cerapeel" (registered trademark) BLK (manufactured by Toray Advanced Film Co., Ltd.) using a slit die coater and then heat-dried at 120° C. for 1.5 hours, thereby obtaining a phosphor-containing resin sheet having an average thickness of about 75 μm.

The thus obtained phosphor-containing resin sheet was subjected to a tensile test in the above-described manner to measure the tensile elastic modulus and the tensile elongation at break. The results thereof are shown in Table 3.

In the evaluation of the cutting workability performed by the above-described method, all of the 100 pieces of the sheet had good shape without any defect such as cracking.

Using a die bonding paste "EN-4900GC" (manufactured by Hitachi Chemical Co., Ltd.), the phosphor-containing resin sheet subjected to the above-described cutting process was pasted onto the surface of a 1 mm-square flip chip-type blue LED chip mounted on a substrate. The resulting chip was heated on a 100° C. hot plate for 1 minute to cure the die bonding paste, thereby obtaining a light-emitting device.

As a result of evaluating the brightness of the thus obtained light-emitting device by the above-described method, the brightness was found to be good at 1.505 cd/cm$^2$. The color temperature variation was evaluated to be small and good at 90 K. Further, in the evaluation of the light resistance by the above-described method, the brightness retention rate (I) was found to be very good at 95%. Moreover, when the heat resistance was evaluated by the above-described method, the brightness retention rate (II) was also found to be good at 83%.

(Examples 20 to 24)—Mixing of Two Kinds of Metal Oxide Particles, Effects of Particle Size of Metal Oxide Particle (I)

The cutting workability, color temperature variation, brightness, light resistance and heat resistance were evaluated by performing the same operations as in Example 19, except that the kind of the metal oxide particle (I) was changed as shown in Table 3. As the average particle size of the metal oxide particle (I) was increased, the elastic modulus tended to be higher and the tensile elongation at break tended to be smaller. Correspondingly, the color temperature variation also tended to be increased; however, these were all within a range of no practical problem in the respective Examples. In Examples 19 to 22, particularly preferred results were obtained. In these Examples, the brightness and the cutting workability were both good and the light resistance was very good. The results of the heat resistance were at a practically acceptable level or better and, particularly, good heat resistance was attained when alumina was used as the metal oxide particle (I).

(Examples 25 to 28)—Mixing of Two Kinds of Metal Oxide Particles, Effects of Phosphor Content The cutting workability, color temperature variation, brightness, light resistance and heat resistance were evaluated by performing the same operations as in Example 19, except that the content of the phosphor was changed as shown in Table 3. As the content of the phosphor was increased, the brightness, light resistance and elastic modulus tended to be higher and the tensile elongation at break tended to be smaller. Correspondingly, the color temperature variation also tended to be increased; however, the results of these properties were all at a practically acceptable level or better in these Examples. On the other hand, as the content of the phosphor was reduced, the brightness retention rate (I) tended to be smaller; however, the brightness and the light resistance were also both at a level of no practical problem or better. The cutting workability and the heat resistance were both good.

(Examples 29 to 32)—Mixing of Two Kinds of Metal Oxide Particles, Effects of Metal Oxide Particle (I) Content The cutting workability, color temperature variation, brightness, light resistance and heat resistance were evaluated by performing the same operations as in Example 19, except that the content of the metal oxide particle (I) was changed as shown in Table 4. In all of these Examples, the results of the cutting workability, color temperature variation and heat resistance were all at a practically acceptable level or better. Particularly, in Examples 30 and 31 where the content of the metal oxide particle (I) was in a range of 3 parts by mass to 20 parts by mass with respect to 100 parts by mass of the resin, particularly preferred results were obtained. In all of these Examples, the brightness was good and the light resistance was very good.

(Examples 33 to 36)—CL Mixing of Two Kinds of Metal Oxide Particles, Effects of Sheet Thickness The cutting workability, color temperature variation, brightness, light resistance and heat resistance were evaluated by performing the same operations as in Example 19, except that the thickness of the phosphor-containing resin sheet was changed as shown in Table 4. In all of these Examples, the cutting workability and the color temperature variation were both good and the light resistance was very good. As the sheet thickness was increased, the brightness tended to be more improved and the brightness retention rate (II) tended to be smaller; however, the heat resistance was at a practically acceptable level or better in all of these Examples. Particularly, in Examples 33 to 35 where the sheet thickness was in a range of 20 μm to 100 μm, good heat resistance was attained. On the other hand, as the sheet thickness was reduced, the brightness also tended to be decreased; however, the results thereof were at a level of no practical problem or better in all of these Examples.

(Examples 37 to 39)—Mixing of Two Kinds of Metal Oxide Particles, Effects of Particle Size of Metal Oxide Particle (II)

The cutting workability, color temperature variation, brightness, light resistance and heat resistance were evaluated by performing the same operations as in Example 19, except that the kind of the metal oxide particle (II) was changed as shown in Table 5. In all of these Examples, the cutting workability, color temperature variation and heat resistance were all good and the light resistance was very good. As the average particle size of the metal oxide particle (II) was increased, the brightness tended to be decreased; however, it was at a practically acceptable level or better. Particularly, in Examples 37 and 38 where the average particle size of the metal oxide particle (II) was in a range of 300 nm to 800 nm, good brightness was attained.

(Examples 40 to 42)—Mixing of Two Kinds of Metal Oxide Particles, Effects of Metal Oxide Particle (II) Content The cutting workability, color temperature variation, brightness, light resistance and heat resistance were evaluated by performing the same operations as in Example 19, except that the content of the metal oxide particle (II) was changed as shown in Table 5. In all of these Examples, the cutting workability, color temperature variation and heat resistance were all good and the light resistance was very good. Depending on the content of the metal oxide particle (II), the brightness tended to be decreased; however, it was at a practically acceptable level or better. Particularly, in Example 41 where the content of the metal oxide particle (II) was in a range of 1 parts by mass to 5 parts by mass with respect to 100 parts by mass of the phosphor, good brightness was attained.

Comparative Examples 6 and 7

The cutting workability, color temperature variation, brightness, light resistance and heat resistance were evaluated by performing the same operations as in Example 19, except that the kinds and concentrations of the metal oxide particles (I) and (II) were changed as shown in Table 13. The phosphor-containing resin sheet was cut into pieces in the same manner as in Example 19; however, only a small number of normal pieces were obtained and the remaining pieces of the phosphor-containing resin sheet were cracked. Cracking occurred also when the pieces of the phosphor-containing resin sheet were pasted to the blue LED, and the color temperature variation was found to be large. The brightness, light resistance and heat resistance were evaluated for the sheets that could be normally cut into pieces and pasted.

Comparative Example 8

The cutting workability, color temperature variation, brightness, light resistance and heat resistance were evaluated by performing the same operations as in Example 19, except that the content of the phosphor as well as the kinds and concentrations of the metal oxide particles (I) and (II) were changed as shown in Table 13. The phosphor-containing resin sheet was cut into pieces in the same manner as in Example 19, and all of the resulting 100 pieces had no defect such as cracking and the color temperature variation was evaluated to be small and good at 98 K. However, the brightness retention rate (I) was poor at 61% and the light resistance was problematic.

Comparative Example 9

It was tried to prepare a phosphor-containing resin sheet in the same manner as in Example 19 except that the content of the phosphor as well as the kinds and concentrations of the metal oxide particles (I) and (II) were changed as shown in Table 13; however, the sheet could not be prepared due to gelation of the paste.

(Example 43)—CL Addition of Silicone Fine Particles

In a polyethylene container, 100 parts by mass of "OE-6630A/B" as a silicone resin, 600 parts by mass of "NYAG-02" (manufactured by Intematix Corporation: Ce-doped YAG-based phosphor, specific gravity: 4.8 g/cm$^3$) as a phosphor, 45 parts by mass of the silicone fine particle 1 and 10 parts by mass of the metal oxide particle 3 as the metal oxide particle (I) were weighed.

Using a planetary stirring/defoaming machine "Mazerustar" (registered trademark) KK-400 (manufactured by Kurabo Industries, Ltd.), the thus weighed materials were stirred and defoamed at 1,000 rpm for 20 minutes. Then, the viscosity of the resultant was adjusted with a dilution solvent to obtain a solution for sheet preparation. This solution for sheet preparation was coated on a base material "Cerapeel" (registered trademark) BLK (manufactured by Toray Advanced Film Co., Ltd.) using a slit die coater and then heat-dried at 120° C. for 1.5 hours, thereby obtaining a phosphor-containing resin sheet having an average thickness of about 75 μm.

The thus obtained phosphor-containing resin sheet was subjected to a tensile test in the above-described manner to measure the tensile elastic modulus and the tensile elongation at break. The results thereof are shown in Table 6.

In the evaluation of the cutting workability performed by the above-described method, all of the 100 pieces of the sheet had good shape without any defect such as cracking.

Using a die bonding paste "EN-4900GC" (manufactured by Hitachi Chemical Co., Ltd.), the phosphor-containing resin sheet subjected to the above-described cutting process was pasted onto the surface of a 1 mm-square flip chip-type blue LED chip mounted on a substrate. The resulting chip was heated on a 100° C. hot plate for 1 minute to cure the die bonding paste, thereby obtaining a light-emitting device.

As a result of evaluating the color temperature variation of the thus obtained light-emitting device by the above-described method, the color temperature variation was found to be very small and very good at 42 K. In addition, the brightness, which was evaluated by the above-described method, was high and good at 1.547 cd/cm$^2$. Further, in the evaluation of the light resistance by the above-described method, the brightness retention rate (I) was found to be very good at 95%. Moreover, when the heat resistance was evaluated by the above-described method, the brightness retention rate (II) was also found to be good at 83%.

(Examples 44 to 47)—Addition of Silicone Fine Particles, Effects of Added Amount of Silicone Fine Particle The cutting workability, color temperature variation, brightness, light resistance and heat resistance were evaluated by performing the same operations as in Example 43, except that the concentration of the silicone fine particle was changed as shown in Table 6. As the concentration of the silicone fine particle was reduced, the elastic modulus tended to be higher, the tensile elongation at break tended to be smaller and the brightness tended to be slightly reduced; however, the results of these properties were all at a practically acceptable level or better in all of these Examples. Particularly, Examples 43 to 46, where the content of the silicone fine particle was in a range of 10 to 50 parts by mass with respect to 100 parts by mass of the silicone resin, yielded good results and, in Examples 43 and 44 where the content was in a range of 30 to 50 parts by mass, particularly preferred results were obtained. In these Examples, the cutting workability and the heat resistance were both good and the light resistance was very good.

(Examples 48 to 52)—Addition of Silicone Fine Particles, Effects of Particle Size of Silicone Fine Particles The cutting workability, color temperature variation, brightness, light resistance and heat resistance were evaluated by performing the same operations as in Example 45, except that the kind of the silicone fine particle was changed as shown in Table 7. In all of these Examples, the cutting workability and the heat resistance were both good, and the color temperature variation and the light resistance were both very good. As the size of the silicone fine particle was increased, the elastic modulus tended to be higher and the tensile elongation at break tended to be smaller. Correspondingly, the color temperature variation also tended to be increased; however, the results of these properties were all at a practically acceptable level or better. Further, depending on the size of the silicone fine particle, the brightness tended to be slightly reduced; however, the results thereof were all at an acceptable level or better from the standpoint of attaining the effects of the present invention. Particularly, in Examples 48 to 51 where the average particle size of the silicone fine particle was not smaller than 0.1 μm and not larger than 2.0 μm, good brightness was attained, and Examples 49 and 50, where the average particle size was not smaller than 0.5 μm and not larger than 1.5 μm, yielded particularly preferred results.

(Examples 53 to 56)—Addition of Silicone Fine Particles, Effects of Added Amount of Metal Oxide Particle (I)

The cutting workability, brightness, color temperature variation, light resistance and heat resistance were evaluated by performing the same operations as in Example 45, except that the concentration of the metal oxide particle (I) was changed as shown in Table 8. In all of these Examples, the cutting workability and the heat resistance were both good, and the color temperature variation and the light resistance were both very good. As the concentration of the metal oxide particle (I) was reduced, the elastic modulus tended to be higher, the tensile elongation at break tended to be smaller and the brightness tended to be slightly reduced; however, the results of these properties were all at a practically acceptable level or better. Particularly, in Examples 53 to 55 where the content of the metal oxide particle (I) was in a range of 3 parts by mass to 30 parts by mass with respect to 100 parts by mass of the silicone resin, preferred results were obtained.

(Examples 57 to 60)—Addition of Silicone Fine Particles, Effects of Phosphor Content The cutting workability, color temperature variation, brightness, light resistance and heat resistance were evaluated by performing the same operations as in Example 45, except that the concentration of the phosphor was changed as shown in Table 9. In all of these Examples, the color temperature variation was very good, and the cutting workability and the brightness were both good. In addition, the results of the light resistance and heat resistance were all at a practically acceptable level or better. As the concentration of the phosphor was increased, the elastic modulus tended to be higher and the tensile elongation at break tended to be smaller. On the other hand, as the concentration of the phosphor was reduced, the light resistance tended to be slightly reduced; however, the results of these properties were all at an acceptable level or better from the standpoint of attaining the effects of the present invention.

(Examples 61 to 64)—Addition of Silicone Fine Particles, Effects of Sheet Thickness The cutting workability, color temperature variation, brightness, light resistance and heat resistance were evaluated by performing the same operations as in Example 45, except that the sheet thickness was changed as shown in Table 10. In all of these Examples, the cutting workability and the brightness were both good, and the color temperature variation and the light resistance were both very good. As the sheet thickness was increased, the brightness retention rate (II) tended to be smaller; however, the results of the heat resistance were all at a practically acceptable level or better. Particularly, in Examples 61 to 63 where the sheet thickness was in a range of 20 μm to 100 μm, good heat resistance was attained.

(Examples 65 to 69)—Addition of Silicone Fine Particles, Effects of Particle Size of Metal Oxide Particle (I)

The cutting workability, color temperature variation, brightness, light resistance and heat resistance were evaluated by performing the same operations as in Example 45, except that the kind of the metal oxide particle (I) was changed as shown in Table 11. In all of these Examples, the cutting workability and the brightness were both good, and the color temperature variation and the light resistance were both very good. The results of the heat resistance were also at a practically acceptable level or better and, particularly, good heat resistance was attained when alumina was used as the metal oxide particle (I). As the average particle size of the metal oxide particle (I) was increased, the elastic modulus tended to be higher and the tensile elongation at break tended to be smaller. Correspondingly, the color temperature variation also tended to be increased; however, the results of these properties were all at a practically acceptable level or better.

Comparative Example 10

The cutting workability, color temperature variation, brightness, light resistance and heat resistance were evaluated by performing the same operations as in Example 45, except that the metal oxide particle (I) was not incorporated. The phosphor-containing resin sheet was cut into pieces in the same manner as in Example 45; however, only 62 normal pieces were obtained and the remaining pieces of the phosphor-containing resin sheet were cracked. Cracking occurred also when the pieces of the phosphor-containing resin sheet were pasted to the blue LED, and the color temperature variation was found to be very large at 245 K. The brightness, light resistance and heat resistance were evaluated for the sheets that could be normally cut into pieces and pasted, and the brightness was found to be low at 1.507 cd/cm$^2$.

Comparative Example 11

The cutting workability, color temperature variation, brightness, light resistance and heat resistance were evaluated by performing the same operations as in Example 45, except that the concentration of the phosphor was changed as shown in Table 14. The phosphor-containing resin sheet was cut into pieces in the same manner as in Example 45; however, the brightness retention rate (I) was 68% and the light resistance was found to be largely reduced.

Comparative Example 12

It was tried to prepare a phosphor-containing resin sheet in the same manner as in Example 45 except that the content of the phosphor was changed as shown in Table 14; however, the sheet could not be prepared due to gelation of the paste.

Comparative Example 13

The cutting workability, color temperature variation, brightness, light resistance and heat resistance were evaluated by performing the same operations as in Example 45, except that the kind of the metal oxide particle (I) was changed as shown in Table 14. The phosphor-containing resin sheet was cut into pieces in the same manner as in Example 43; however, only 54 normal pieces were obtained and the remaining pieces of the phosphor-containing resin sheet were cracked. Cracking occurred also when the pieces of the phosphor-containing resin sheet were pasted to the blue LED, and the color temperature variation was found to be very large at 268 K. It is noted here that the brightness, light resistance and heat resistance were evaluated for those samples that could be normally cut into pieces and pasted.

Comparative Example 14

The cutting workability, color temperature variation, brightness, light resistance and heat resistance were evaluated by performing the same operations as in Example 45, except that the kind of the metal oxide particle (I) was changed as shown in Table 14. The phosphor-containing resin sheet was cut into pieces in the same manner as in Example 43; however, only 71 normal pieces were obtained and the remaining pieces of the phosphor-containing resin sheet were cracked. Cracking occurred also when the pieces of the phosphor-containing resin sheet were pasted to the blue LED, and the color temperature variation was found to be very large at 205 K. It is noted here that the brightness, light resistance and heat resistance were evaluated for those samples that could be normally cut into pieces and pasted.

TABLE 1

| | | Example 1 | Example 2 | Example 3 | Example 4 | Example 5 |
|---|---|---|---|---|---|---|
| Silicone resin (refractive index: 1.53) | | 100 parts | 100 parts | 100 parts | 100 parts | 100 parts |
| Phosphor (YAG) | | 600 parts | 600 parts | 600 parts | 600 parts | 600 parts |
| Metal oxide particle 1 (particle size: 7 nm, refractive index: 1.76) | | — | — | — | — | — |
| Metal oxide particle 2 (particle size: 12 nm, refractive index: 1.48) | | — | 10 parts | — | — | — |
| Metal oxide particle 3 (particle size: 13 nm, refractive index: 1.76) | | 10 parts | — | — | — | — |
| Metal oxide particle 4 (particle size: 30 nm, refractive index 1.76) | | — | — | 10 parts | — | — |
| Metal oxide particle 5 (particle size: 36 nm, refractive index: 2.62) | | — | — | — | 10 parts | — |
| Metal oxide particle 6 (particle size: 100 nm, refractive index: 1.76) | | — | — | — | — | 10 parts |
| Metal oxide particle 7 (particle size: 200 nm, refractive index: 1.76) | | — | — | — | — | — |
| Metal oxide particle 9 (particle size: 500 nm, refractive index: 1.76) | | — | — | — | — | — |
| Physical property values of phosphor sheet | Tensile elastic modulus (MPa) | 590 | 584 | 601 | 650 | 701 |
| | Tensile elongation at break (%) | 11.8 | 12.1 | 11.6 | 10.5 | 9.2 |
| Sheet thickness (μm) | | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 92 | 105 | 101 | 121 | 138 |
| Brightness (cd/cm2) | | 1.505 | 1.504 | 1.507 | 1.505 | 1.506 |
| Brightness retention rate-I (%) | | 95 | 95 | 95 | 95 | 95 |
| Light resistance | | S | S | S | S | S |
| Brightness retention rate-II (%) | | 83 | 77 | 82 | 78 | 85 |
| Heat resistance | | A | B | A | B | A |

| | Example 6 | Example 7 | Example 8 | Example 9 | Example 10 |
|---|---|---|---|---|---|
| Silicone resin (refractive index: 1.53) | 100 parts | 100 parts | 100 parts | 100 parts | 100 parts |
| Phosphor (YAG) | 600 parts | 250 parts | 400 parts | 800 parts | 1000 parts |
| Metal oxide particle 1 (particle size: 7 nm, refractive index: 1.76) | — | — | — | — | — |
| Metal oxide particle 2 (particle size: 12 nm, refractive index: 1.48) | — | — | — | — | — |
| Metal oxide particle 3 (particle size: 13 nm, refractive index: 1.76) | — | 10 parts | 10 parts | 10 parts | 10 parts |

TABLE 1-continued

| | | | | | | |
|---|---|---|---|---|---|---|
| Metal oxide particle 4 (particle size: 30 nm, refractive index: 1.76) | | — | — | — | — | — |
| Metal oxide particle 5 (particle size: 36 nm, refractive index: 2.62) | | — | — | — | — | — |
| Metal oxide particle 6 (particle size: 100 nm, refractive index: 1.76) | | — | — | — | — | — |
| Metal oxide particle 7 (particle size: 200 nm, refractive index: 1.76) | | 10 parts | — | — | — | — |
| Metal oxide particle 9 (particle size: 500 nm, refractive index: 1.76) | | — | — | — | — | — |
| Physical property values of phosphor sheet | Tensile elastic modulus (MPa) | 748 | 421 | 520 | 799 | 980 |
| | Tensile elongation at break (%) | 8.2 | 15.3 | 13.1 | 7.9 | 5.3 |
| Sheet thickness (μm) | | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 148 | 94 | 95 | 115 | 136 |
| Brightness (cd/cm2) | | 1.505 | 1.184 | 1.495 | 1.519 | 1.530 |
| Brightness retention rate-I (%) | | 96 | 86 | 91 | 95 | 96 |
| Light resistance | | S | B | A | S | S |
| Brightness retention rate-II (%) | | 86 | 81 | 82 | 82 | 83 |
| Heat resistance | | A | A | A | A | A |

TABLE 2

| | | Example 11 | Example 12 | Example 13 | Example 14 |
|---|---|---|---|---|---|
| Silicone resin (refractive index: 1.53) | | 100 parts | 100 parts | 100 parts | 100 parts |
| Phosphor (YAG) | | 600 parts | 600 parts | 600 parts | 600 parts |
| Metal oxide particle 1 (particle size: 7 nm, refractive index: 1.76) | | — | — | — | — |
| Metal oxide particle 2 (particle size: 12 nm, refractive index: 1.48) | | — | — | — | — |
| Metal oxide particle 3 (particle size: 13 nm, refractive index: 1.76) | | 1 parts | 5 parts | 15 parts | 25 parts |
| Metal oxide particle 4 (particle size: 30 nm, refractive index: 1.76) | | — | — | — | — |
| Metal oxide particle 5 (particle size: 36 nm, refractive index: 2.62) | | — | — | — | — |
| Metal oxide particle 6 (particle size: 100 nm, refractive index: 1.76) | | — | — | — | — |
| Metal oxide particle 7 (particle size: 200 nm, refractive index: 1.76) | | — | — | — | — |
| Metal oxide particle 9 (particle size: 500 nm, refractive index: 1.76) | | — | — | — | — |
| Physical property values of phosphor sheet | Tensile elastic modulus (MPa) | 891 | 675 | 680 | 921 |
| | Tensile elongation at break (%) | 6.6 | 10.2 | 10.1 | 6.4 |
| Sheet thickness (μm) | | 75 | 75 | 75 | 75 |
| Cutting workability | Number of normally cut pieces out of 100 pieces | 93 | 100 | 100 | 90 |
| LED light-up test | Color temperature variation (K) | 148 | 123 | 124 | 150 |
| Brightness (cd/cm2) | | 1.503 | 1.504 | 1.502 | 1.500 |
| Brightness retention rate - I (%) | | 95 | 95 | 95 | 95 |
| Light resistance | | S | S | S | S |
| Brightness retention rate - II (%) | | 76 | 81 | 83 | 85 |
| Heat resistance | | B | A | A | A |

| | | Example 15 | Example 16 | Example 17 | Example 18 |
|---|---|---|---|---|---|
| Silicone resin (refractive index: 1.53) | | 100 parts | 100 parts | 100 parts | 100 parts |
| Phosphor (YAG) | | 600 parts | 600 parts | 600 parts | 600 parts |
| Metal oxide particle 1 (particle size: 7 nm, refractive index: 1.76) | | — | — | — | — |
| Metal oxide particle 2 (particle size: 12 nm, refractive index: 1.48) | | — | — | — | — |
| Metal oxide particle 3 (particle size: 13 nm, refractive index: 1.76) | | 10 parts | 10 parts | 10 parts | 10 parts |
| Metal oxide particle 4 (particle size: 30 nm, refractive index: 1.76) | | — | — | — | — |
| Metal oxide particle 5 (particle size: 36 nm, refractive index: 2.62) | | — | — | — | — |
| Metal oxide particle 6 (particle size: 100 nm, refractive index: 1.76) | | — | — | — | — |
| Metal oxide particle 7 (particle size: 200 nm, refractive index: 1.76) | | — | — | — | — |

TABLE 2-continued

| | | | | | |
|---|---|---|---|---|---|
| Metal oxide particle 9 (particle size: 500 nm, refractive index: 1.76) | | — | — | — | — |
| Physical property values of phosphor sheet | Tensile elastic modulus (MPa) | 589 | 587 | 595 | 591 |
| | Tensile elongation at break (%) | 11.7 | 11.9 | 11.8 | 11.8 |
| Sheet thickness (μm) | | 25 | 40 | 90 | 130 |
| Cutting workability | Number of normally cut pieces out of 100 pieces | 100 | 100 | 100 | 100 |
| LED light-up test | Color temperature variation (K) | 115 | 96 | 95 | 93 |
| Brightness (cd/cm2) | | 1.481 | 1.493 | 1.516 | 1.533 |
| Brightness retention rate - I (%) | | 95 | 95 | 95 | 95 |
| Light resistance | | S | S | S | S |
| Brightness retention rate - II (%) | | 90 | 89 | 84 | 75 |
| Heat resistance | | S | A | A | B |

TABLE 3

| | | Example 19 | Example 20 | Example 21 | Example 22 | Example 23 |
|---|---|---|---|---|---|---|
| Silicone resin (refractive index: 1.53) | | 100 parts | 100 parts | 100 parts | 100 parts | 100 parts |
| Phosphor (YAG) | | 600 parts | 600 parts | 600 parts | 600 parts | 600 parts |
| Metal oxide particle 1 (particle size: 7 nm, refractive index: 1.76) | | — | — | — | — | — |
| Metal oxide particle 2 (particle size: 12 nm, refractive index: 1.48) | | — | 10 parts | — | — | — |
| Metal oxide particle 3 (particle size: 13 nm, refractive index: 1.76) | | 10 parts | — | — | — | — |
| Metal oxide particle 4 (particle size: 30 nm, refractive index: 1.76) | | — | — | 10 parts | — | — |
| Metal oxide particle 5 (particle size: 36 nm, refractive index: 2.62) | | — | — | — | 10 parts | — |
| Metal oxide particle 6 (particle size: 100 nm, refractive index: 1.76) | | — | — | — | — | 10 parts |
| Metal oxide particle 7 (particle size: 200 nm, refractive index: 1.76) | | — | — | — | — | — |
| Metal oxide particle 8 (particle size: 300 nm, refractive index: 1.76) | | — | — | — | — | — |
| Metal oxide particle 9 (particle size: 500 nm, refractive index: 1.76) | | 6 parts | 6 parts | 6 parts | 6 parts | 6 parts |
| Metal oxide particle 10 (particle size: 700 nm, refractive index: 1.76) | | — | — | — | — | — |
| Metal oxide particle 11 (particle size: 1000 nm, refractive index: 1.76) | | — | — | — | — | — |
| Metal oxide particle 12 (particle size: 1200 nm, refractive index: 1.76) | | — | — | — | — | — |
| Physical property values of phosphor sheet | Elastic modulus (MPa) | 591 | 535 | 803 | 853 | 703 |
| | Elongation at break (%) | 11.8 | 12.0 | 11.9 | 10.4 | 9.1 |
| Sheet thickness (μm) | | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 90 | 104 | 100 | 119 | 137 |
| Brightness (cd/cm2) | | 1.550 | 1.549 | 1.543 | 1.547 | 1.547 |
| Brightness retention rate-I (%) | | 95 | 95 | 95 | 95 | 96 |
| Light resistance | | S | S | S | S | S |
| Brightness retention rate-II (%) | | 83 | 78 | 82 | 77 | 84 |
| Heat resistance | | A | B | A | B | A |

| | | Example 24 | Example 25 | Example 26 | Example 27 | Example 28 |
|---|---|---|---|---|---|---|
| Silicone resin (refractive index: 1.53) | | 100 parts | 100 parts | 100 parts | 100 parts | 100 parts |
| Phosphor (YAG) | | 600 parts | 250 parts | 400 parts | 800 parts | 1000 parts |
| Metal oxide particle 1 (particle size: 7 nm, refractive index: 1.76) | | — | — | — | — | — |
| Metal oxide particle 2 (particle size: 12 nm, refractive index: 1.48) | | — | — | — | — | — |
| Metal oxide particle 3 (particle size: 13 nm, refractive index: 1.76) | | — | 10 parts | 10 parts | 10 parts | 10 parts |
| Metal oxide particle 4 (particle size: 30 nm, refractive index: 1.76) | | — | — | — | — | — |
| Metal oxide particle 5 (particle size: 36 nm, refractive index: 2.62) | | — | — | — | — | — |
| Metal oxide particle 6 (particle size: 100 nm, refractive index: 1.76) | | — | — | — | — | — |
| Metal oxide particle 7 (particle size: 200 nm, refractive index: 1.76) | | 10 parts | — | — | — | — |
| Metal oxide particle 8 (particle size: 300 nm, refractive index: 1.76) | | — | — | — | — | — |
| Metal oxide particle 9 (particle size: 500 nm, refractive index: 1.76) | | 6 parts | 6 parts | 6 parts | 6 parts | 6 parts |
| Metal oxide particle 10 (particle size: 700 nm, refractive index: 1.76) | | — | — | — | — | — |
| Metal oxide particle 11 (particle size: 1000 nm, refractive index: 1.76) | | — | — | — | — | — |
| Metal oxide particle 12 (particle size: 1200 nm, refractive index: 1.76) | | — | — | — | — | — |
| Physical property values of phosphor sheet | Elastic modulus (MPa) | 750 | 426 | 525 | 800 | 979 |
| | Elongation at break (%) | 8.1 | 15.2 | 12.9 | 8.0 | 5.5 |
| Sheet thickness (μm) | | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 146 | 94 | 93 | 114 | 138 |
| Brightness (cd/cm2) | | 1.548 | 1.528 | 1.539 | 1.564 | 1.575 |
| Brightness retention rate-I (%) | | 96 | 86 | 91 | 95 | 96 |
| Light resistance | | S | B | A | S | S |

TABLE 3-continued

| | | | | | |
|---|---|---|---|---|---|
| Brightness retention rate-II (%) | 85 | 82 | 82 | 82 | 83 |
| Heat resistance | A | A | A | A | A |

TABLE 4

| | | Example 29 | Example 30 | Example 31 | Example 32 |
|---|---|---|---|---|---|
| Silicone resin (refractive index: 1.53) | | 100 parts | 100 parts | 100 parts | 100 parts |
| Phosphor (YAG) | | 600 parts | 600 parts | 600 parts | 600 parts |
| Metal oxide particle 1 (particle size: 7 nm, refractive index: 1.76) | | — | — | — | — |
| Metal oxide particle 2 (particle size: 12 nm, refractive index: 1.48) | | — | — | — | — |
| Metal oxide particle 3 (particle size: 13 nm, refractive index: 1.76) | | 1 parts | 5 parts | 15 parts | 25 parts |
| Metal oxide particle 4 (particle size: 30 nm, refractive index: 1.76) | | — | — | — | — |
| Metal oxide particle 5 (particle size: 36 nm, refractive index: 2.62) | | — | — | — | — |
| Metal oxide particle 6 (particle size: 100 nm, refractive index: 1.76) | | — | — | — | — |
| Metal oxide particle 7 (particle size: 200 nm, refractive index: 1.76) | | — | — | — | — |
| Metal oxide particle 8 (particle size: 300 nm, refractive index: 1.76) | | — | — | — | — |
| Metal oxide particle 9 (particle size: 500 nm, refractive index: 1.76) | | 6 parts | 6 parts | 6 parts | 6 parts |
| Metal oxide particle 10 (particle size: 700 nm, refractive index: 1.76) | | — | — | — | — |
| Metal oxide particle 11 (particle size: 1000 nm, refractive index: 1.76) | | — | — | — | — |
| Metal oxide particle 12 (particle size: 1200 nm, refractive index: 1.76) | | — | — | — | — |
| Physical property values of phosphor sheet | Elastic modulus (MPa) | 891 | 675 | 680 | 921 |
| | Elongation at break (%) | 6.6 | 10.2 | 10.1 | 6.4 |
| Sheet thickness (μm) | | 75 | 75 | 75 | 75 |
| Cutting workability | Number of normally cut pieces out of 100 pieces | 93 | 100 | 100 | 90 |
| LED light-up test | Color temperature variation (K) | 148 | 123 | 124 | 150 |
| Brightness (cd/cm2) | | 1.551 | 1.549 | 1.550 | 1.548 |
| Brightness retention rate - I (%) | | 95 | 95 | 95 | 95 |
| Light resistance | | S | S | S | S |
| Brightness retention rate - II (%) | | 76 | 81 | 83 | 85 |
| Heat resistance | | B | A | A | A |

| | | Example 33 | Example 34 | Example 35 | Example 36 |
|---|---|---|---|---|---|
| Silicone resin (refractive index: 1.53) | | 100 parts | 100 parts | 100 parts | 100 parts |
| Phosphor (YAG) | | 600 parts | 600 parts | 600 parts | 600 parts |
| Metal oxide particle 1 (particle size: 7 nm, refractive index: 1.76) | | — | — | — | — |
| Metal oxide particle 2 (particle size: 12 nm, refractive index: 1.48) | | — | — | — | — |
| Metal oxide particle 3 (particle size: 13 nm, refractive index: 1.76) | | 10 parts | 10 parts | 10 parts | 10 parts |
| Metal oxide particle 4 (particle size: 30 nm, refractive index: 1.76) | | — | — | — | — |
| Metal oxide particle 5 (particle size: 36 nm, refractive index: 2.62} | | — | — | — | — |
| Metal oxide particle 6 (particle size: 100 nm, refractive index: 1.76) | | — | — | — | — |
| Metal oxide particle 7 (particle size: 200 nm, refractive index: 1.76) | | — | — | — | — |
| Metal oxide particle 8 (particle size: 300 nm, refractive index: 1.76} | | — | — | — | — |
| Metal oxide particle 9 (particle size: 500 nm, refractive index: 1.76} | | 6 parts | 6 parts | 6 parts | 6 parts |
| Metal oxide particle 10 (particle size: 700 nm, refractive index 1.76) | | — | — | — | — |

TABLE 4-continued

|  |  |  |  |  |  |
|---|---|---|---|---|---|
| Metal oxide particle 11 (particle size: 1000 nm, refractive index: 1.76) |  | — | — | — | — |
| Metal oxide particle 12 (particle size: 1200 nm, refractive index: 1.76) |  | — | — | — | — |
| Physical property values of phosphor sheet | Elastic modulus (MPa) | 589 | 587 | 595 | 591 |
|  | Elongation at break (%) | 11.7 | 11.9 | 11.8 | 11.8 |
| Sheet thickness (μm) |  | 25 | 40 | 90 | 130 |
| Cutting workability | Number of normally cut pieces out of 100 pieces | 100 | 100 | 100 | 100 |
| LED light-up test | Color temperature variation (K) | 115 | 96 | 95 | 93 |
| Brightness (cd/cm2) |  | 1.528 | 1.544 | 1.563 | 1.576 |
| Brightness retention rate - I (%) |  | 95 | 95 | 95 | 95 |
| Light resistance |  | S | S | S | S |
| Brightness retention rate - II (%) |  | 90 | 89 | 84 | 75 |
| Heat resistance |  | S | A | A | B |

TABLE 5

|  |  | Example 37 | Example 38 | Example 39 | Example 40 | Example 41 | Example 42 |
|---|---|---|---|---|---|---|---|
| Silicone resin (refractive index: 1.53) |  | 100 parts | 100 parts | 100 parts | 100 parts | 100 parts | 100 parts |
| Phosphor (YAG) |  | 600 parts | 600 parts | 600 parts | 600 parts | 600 parts | 600 parts |
| Metal oxide particle 1 (particle size: 7 nm refractive index: 1.76) |  | — | — | — | — | — | — |
| Metal oxide particle 2 (particle size: 12 nm, refractive index: 1.48) |  | — | — | — | — | — | — |
| Metal oxide particle 3 (particle size: 13 nm, refractive index: 1.76) |  | 10 parts | 10 parts | 10 parts | 10 parts | 10 parts | 10 parts |
| Metal oxide particle 4 (particle size: 30 nm, refractive index: 1.76) |  | — | — | — | — | — | — |
| Metal oxide particle 5 (particle size: 36 nm, refractive index: 2.62) |  | — | — | — | — | — | — |
| Metal oxide particle 6 (particle size: 100 nm, refractive index: 1.76) |  | — | — | — | — | — | — |
| Metal oxide particle 7 (particle size: 200 nm, refractive index: 1.76) |  | — | — | — | — | — | — |
| Metal oxide particle 8 (particle size: 300 nm, refractive index: 1.76) |  | 6 parts | — | — | — | — | — |
| Metal oxide particle 9 (particle size: 500 nm, refractive index: 1.76) |  | — | — | — | 0.6 parts | 30 parts | 60 parts |
| Metal oxide particle 10 (particle: size: 700 nm, refractive index: 1.76) |  | — | 6 parts | — | — | — | — |
| Metal oxide particle 11 (particle size: 1000 nm, refractive index: 1.76) |  | — | — | 6 parts | — | — | — |
| Metal oxide particle 12 (particle size: 1200 nm, refractive index: 1.76) |  | — | — | — | — | — | — |
| Physical property values of phosphor sheet | Elastic modulus (MPa) | 591 | 593 | 594 | 590 | 601 | 632 |
|  | Elongation at break (%) | 11.7 | 11.8 | 11.9 | 11.8 | 11.5 | 10.9 |
| Sheet thickness (μm) |  | 75 | 75 | 75 | 75 | 75 | 75 |
| Cutting workability | Number of normally cut pieces out of 100 pieces | 100 | 100 | 100 | 100 | 100 | 100 |
| LED light-up test | Color temperature variation (K) | 92 | 91 | 92 | 92 | 92 | 92 |
| Brightness (cd/cm2) |  | 1.545 | 1.547 | 1.535 | 1.535 | 1.549 | 1.521 |
| Brightness retention rate-I (%) |  | 95 | 95 | 95 | 95 | 95 | 95 |
| Light resistance |  | S | S | S | S | S | S |
| Brightness retention rate-II (%) |  | 83 | 83 | 82 | 83 | 83 | 82 |
| Heat resistance |  | A | A | A | A | A | A |

TABLE 6

|  | Example 43 | Example 44 | Example 45 | Example 46 | Example 47 |
|---|---|---|---|---|---|
| Silicone resin (refractive index: 1.53) | 100 parts | 100 parts | 100 parts | 100 parts | 100 parts |
| Phosphor (YAG) | 600 parts | 600 parts | 600 parts | 600 parts | 600 parts |

TABLE 6-continued

|  |  | Example 43 | Example 44 | Example 45 | Example 46 | Example 47 |
|---|---|---|---|---|---|---|
| Silicone fine particle 1 (particle size: 0.5 μm) |  | 45 parts | 35 parts | 25 parts | 15 parts | 5 parts |
| Metal oxide particle 3 (particle size: 13 nm, refractive index: 1.76) |  | 10 parts | 10 parts | 10 parts | 10 parts | 10 parts |
| Physical property values of phosphor sheet | Elastic modulus (MPa) | 435 | 482 | 504 | 524 | 541 |
|  | Elongation at break (%) | 18.4 | 17.1 | 15.2 | 14.7 | 13.1 |
| Sheet thickness (μm) |  | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 42 | 47 | 51 | 55 | 60 |
| Brightness (cd/cm2) |  | 1.547 | 1.541 | 1.537 | 1.535 | 1.522 |
| Brightness retention rate-I (%) |  | 95 | 96 | 95 | 95 | 96 |
| Light resistance |  | S | S | S | S | S |
| Brightness retention rate-II (%) |  | 83 | 81 | 82 | 81 | 81 |
| Heat resistance |  | A | A | A | A | A |

TABLE 7

|  |  | Example 48 | Example 49 | Example 50 | Example 51 | Example 52 |
|---|---|---|---|---|---|---|
| Silicone resin (refractive index: 1.53) |  | 100 parts | 100 parts | 100 parts | 100 parts | 100 parts |
| Phosphor (YAG) |  | 600 parts | 600 parts | 600 parts | 600 parts | 600 parts |
| Metal oxide particle 3 (particle size: 13 nm, refractive index: 1.76) |  | 10 parts | 10 parts | 10 parts | 10 parts | 10 parts |
| Silicone fine particle 2 | particle size: 0.1 μm | 25 parts | — | — | — | — |
| Silicone fine particle 3 | particle size: 1.0 μm | — | 25 parts | — | — | — |
| Silicone fine particle 4 | particle size: 1.5 μm | — | — | 25 parts | — | — |
| Silicone fine particle 5 | particle size: 2.0 μm | — | — | — | 25 parts | — |
| Silicone fine particle 6 | particle size: 5.0 μm | — | — | — | — | 25 parts |
| Physical property values of phosphor sheet | Elastic modulus (MPa) | 469 | 490 | 507 | 522 | 573 |
|  | Elongation at break (%) | 17.0 | 15.8 | 14.4 | 13.8 | 12.2 |
| Sheet thickness (μm) |  | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 49 | 43 | 54 | 58 | 73 |
| Brightness (cd/cm2) |  | 1.527 | 1.538 | 1.536 | 1.525 | 1.516 |
| Brightness retention rate-I (%) |  | 95 | 95 | 96 | 96 | 95 |
| Light resistance |  | S | S | S | S | S |
| Brightness retention rate-II (%) |  | 81 | 82 | 83 | 83 | 82 |
| Heat resistance |  | A | A | A | A | A |

TABLE 8

|  |  | Example 53 | Example 54 | Example 55 | Example 56 |
|---|---|---|---|---|---|
| Silicone resin (refractive index: 1.53) |  | 100 parts | 100 parts | 100 parts | 100 parts |
| Phosphor (YAG) |  | 600 parts | 600 parts | 600 parts | 600 parts |
| Silicone fine particle 1 (particle size: 0.5 μm) |  | 25 parts | 25 parts | 25 parts | 25 parts |
| Metal oxide particle 3 (particle size: 13 nm, refractive index: 1.76) |  | 25 parts | 15 parts | 5 parts | 1 parts |
| Physical property values of phosphor sheet | Elastic modulus (MPa) | 350 | 515 | 690 | 819 |
|  | Elongation at break (%) | 27.4 | 18.9 | 12.7 | 7.5 |
| Sheet thickness (μm) |  | 75 | 75 | 75 | 75 |
| Cutting workability | Number of normally cut pieces out of 100 pieces | 100 | 100 | 100 | 100 |
| LED light-up test | Color temperature variation (K) | 62 | 55 | 51 | 64 |
| Brightness (cd/cm2) |  | 1.536 | 1.541 | 1.539 | 1.527 |
| Brightness retention rate - I (%) |  | 95 | 96 | 95 | 95 |

TABLE 8-continued

|  | Example 53 | Example 54 | Example 55 | Example 56 |
|---|---|---|---|---|
| Light resistance | S | S | S | S |
| Brightness retention rate - II (%) | 81 | 82 | 84 | 81 |
| Heat resistance | A | A | A | A |

TABLE 9

|  |  | Example 57 | Example 58 | Example 59 | Example 60 |
|---|---|---|---|---|---|
| Silicone resin (refractive index: 1.53) |  | 100 parts | 100 parts | 100 parts | 100 parts |
| Phosphor (YAG) |  | 250 parts | 400 parts | 800 parts | 1000 parts |
| Silicone fine particle 1 (particle size: 0.5 µm) |  | 25 parts | 25 parts | 25 parts | 25 parts |
| Metal oxide particle 3 (particle size: 13 nm, refractive index: 1.76) |  | 10 parts | 10 parts | 10 parts | 10 parts |
| Physical property values of phosphor sheet | Elastic modulus (MPa) | 335 | 482 | 745 | 859 |
|  | Elongation at break (%) | 29.0 | 21.5 | 7.5 | 5.3 |
| Sheet thickness (µm) |  | 75 | 75 | 75 | 75 |
| Cutting workability | Number of normally cut pieces out of 100 pieces | 100 | 100 | 100 | 100 |
| LED light-up test | Color temperature variation (K) | 41 | 47 | 64 | 73 |
| Brightness (cd/cm2) |  | 1.521 | 1.529 | 1.552 | 1.563 |
| Brightness retention rate - I (%) |  | 84 | 92 | 95 | 96 |
| Light resistance |  | B | A | S | S |
| Brightness retention rate - II (%) |  | 79 | 81 | 82 | 81 |
| Heat resistance |  | B | A | A | A |

TABLE 10

|  |  | Example 61 | Example 62 | Example 63 | Example 64 |
|---|---|---|---|---|---|
| Silicone resin (refractive index: 1.53) |  | 100 parts | 100 parts | 100 parts | 100 parts |
| Phosphor (YAG) |  | 600 parts | 600 parts | 600 parts | 600 parts |
| Silicone fine particle 1 (particle size: 0.5 µm) |  | 25 parts | 25 parts | 25 parts | 25 parts |
| Metal oxide particle 3 (particle size: 13 nm, refractive index: 1.76) |  | 10 parts | 10 parts | 10 parts | 10 parts |
| Physical property values of phosphor sheet | Elastic modulus (MPa) | 495 | 510 | 501 | 504 |
|  | Elongation at break (%) | 15.5 | 15.1 | 15.4 | 15.5 |
| Sheet thickness (µm) |  | 25 | 40 | 90 | 130 |
| Cutting workability | Number of normally cut pieces out of 100 pieces | 100 | 100 | 100 | 100 |
| LED light-up test | Color temperature variation (K) | 58 | 57 | 47 | 34 |
| Brightness (cd/cm2) |  | 1.512 | 1.526 | 1.548 | 1.564 |
| Brightness retention rate - I (%) |  | 95 | 96 | 95 | 95 |
| Light resistance |  | S | S | S | S |
| Brightness retention rate - II (%) |  | 90 | 89 | 84 | 75 |
| Heat resistance |  | S | A | A | B |

TABLE 11

|  |  | Example 65 | Example 66 | Example 67 | Example 68 | Example 69 |
|---|---|---|---|---|---|---|
| Silicone resin (refractive index: 1.53) |  | 100 parts | 100 parts | 100 parts | 100 parts | 100 parts |
| Phosphor (YAG) |  | 600 parts | 600 parts | 600 parts | 600 parts | 600 parts |
| Silicone fine particle 1 (particle size: 0.5 μm) |  | 25 parts | 25 parts | 25 parts | 25 parts | 25 parts |
| Metal oxide particle 1 (particle size: 7 nm, refractive index: 1.76) |  | — | — | — | — | — |
| Metal oxide particle 2 (particle size: 12 nm, refractive index: 1.48) |  | 10 parts | — | — | — | — |
| Metal oxide particle 4 (particle size: 30 nm, refractive index: 1.76) |  | — | 10 parts | — | — | — |
| Metal oxide particle 5 (particle size: 36 nm, refractive index: 2.62) |  | — | — | 10 parts | — | — |
| Metal oxide particle 6 (particle size: 100 nm, refractive index: 1.76) |  | — | — | — | 10 parts | — |
| Metal oxide particle 7 (particle size: 200 nm, refractive index: 1.76) |  | — | — | — | — | 10 parts |
| Metal oxide particle 9 (particle size: 500 nm, refractive index: 1.76) |  | — | — | — | — | — |
| Physical property values of phosphor sheet | Elastic modulus (MPa) | 480 | 491 | 580 | 697 | 825 |
|  | Elongation at break (%) | 14.9 | 15.2 | 13.0 | 12.1 | 10.2 |
| Sheet thickness (μm) |  | 75 | 75 | 75 | 75 | 75 |
| Cutting workability | Number of normally cut pieces out of 100 pieces | 100 | 100 | 100 | 100 | 100 |
| LED light-up test | Color temperature variation (K) | 45 | 47 | 48 | 47 | 65 |
| Brightness (cd/cm2) |  | 1.537 | 1.534 | 1.532 | 1.535 | 1.532 |
| Brightness retention rate-I (%) |  | 95 | 96 | 95 | 96 | 96 |
| Light resistance |  | S | S | S | S | S |
| Brightness retention rate-II (%) |  | 77 | 82 | 78 | 85 | 86 |
| Heat resistance |  | B | A | B | A | A |

TABLE 12

|  |  | Comparative Example 1 | Comparative Example 2 | Comparative Example 3 | Comparative Example 4 | Comparative Example 5 |
|---|---|---|---|---|---|---|
| Silicone resin (refractive index: 1.53) |  | 100 parts | 100 parts | 100 parts | 100 parts | 100 parts |
| Phosphor (YAG) |  | 600 parts | 600 parts | 600 parts | 200 parts | 1100 parts |
| Metal oxide particle 1 (particle size: 7 nm, refractive index: 1.76) |  | 10 parts | — | — | — | — |
| Metal oxide particle 2 (particle size: 12 nm, refractive index: 1.48) |  | — | — | — | — | — |
| Metal oxide particle 3 (particle size: 13 nm, refractive index: 1.76) |  | — | — | — | 10 parts | 10 parts |
| Metal oxide particle 4 (particle size: 30 nm, refractive index: 1.76) |  | — | — | — | — | — |
| Metal oxide particle 5 (particle size: 36 nm, refractive index: 2.62) |  | — | — | — | — | — |
| Metal oxide particle 6 (particle size: 100 nm, refractive index: 1.76) |  | — | — | — | — | — |
| Metal oxide particle 7 (particle size: 200 nm, refractive index: 1.76) |  | — | — | — | — | — |
| Metal oxide particle 9 (particle size: 500 nm, refractive index: 1.76) |  | — | 10 parts | — | — | — |
| Physical property values of phosphor sheet | Tensile elastic modulus (MPa) | 1021 | 1234 | 1201 | 359 | — |
|  | Tensile elongation at break (%) | 2.9 | 1.5 | 1.6 | 20.1 | — |
| Sheet thickness |  | 75 | 75 | 75 | 75 | — |
| Cutting workability | Number of normally cut pieces out of 100 pieces | 58 | 43 | 45 | 100 | — |
| LED light-up test | Color temperature variation (K) | 243 | 293 | 284 | 95 | — |
| Brightness (cd/cm2) |  | 1.506 | 1.498 | 1.503 | 1.469 | — |
| Brightness retention rate-I (%) |  | 94 | 93 | 92 | 62 | — |
| Light resistance |  | A | A | A | C | — |
| Brightness retention rate-II (%) |  | 80 | 79 | 79 | 79 | — |
| Heat resistance |  | B | B | B | B | — |

TABLE 13

|  | Comparative Example 6 | Comparative Example 7 | Comparative Example 8 | Comparative Example 9 |
|---|---|---|---|---|
| Silicone resin (refractive index: 1.53) | 100 parts | 100 parts | 100 parts | 100 parts |
| Phosphor (YAG) | 600 parts | 600 parts | 200 parts | 1100 parts |
| Metal oxide particle 1 (particle size: 7 nm, refractive index: 1.76) | 10 parts | — | — | — |
| Metal oxide particle 2 (particle size: 12 nm, refractive index: 1.48) | — | — | — | — |
| Metal oxide particle 3 (particle size: 13 nm, refractive index: 1.76) | — | — | 10 parts | 10 parts |

TABLE 13-continued

|  |  | Comparative Example 6 | Comparative Example 7 | Comparative Example 8 | Comparative Example 9 |
|---|---|---|---|---|---|
| Metal oxide particle 4 (particle size: 30 nm, refractive index: 1.76) | | — | — | — | — |
| Metal oxide particle 5 (particle size: 36 nm, refractive index: 2.62) | | — | — | — | — |
| Metal oxide particle 6 (particle size: 100 nm, refractive index: 1.76) | | — | — | — | — |
| Metal oxide particle 7 (particle size: 200 nm, refractive index: 1.76) | | — | — | — | — |
| Metal oxide particle 8 (particle size: 300 nm, refractive index: 1.76) | | — | 10 parts | — | — |
| Metal oxide particle 9 (particle size: 500 nm, refractive index: 1.76) | | 3 parts | 3 parts | 3 parts | 3 parts |
| Metal oxide particle 10 (particle size: 700 nm, refractive index 1.76) | | — | — | — | — |
| Metal oxide particle 11 (particle size: 1000 nm, refractive index: 1.76) | | — | — | — | — |
| Metal oxide particle 12 (particle size: 1200 nm, refractive index: 1.76) | | — | — | — | — |
| Physical property values of phosphor sheet | Elastic modulus (MPa) | 1045 | 964 | 365 | — |
|  | Elongation at break (%) | 2.4 | 3.7 | 19.7 | — |
| Sheet thickness (μm) | | 75 | 75 | 75 | — |
| Cutting workability | Number of normally cut pieces out of 100 pieces | 54 | 67 | 100 | — |
| LED light-up test | Color temperature variation (K) | 254 | 223 | 98 | — |
| Brightness (cd/cm2) | | 1.543 | 1.544 | 1.526 | — |
| Brightness retention rate - I (%) | | 93 | 92 | 61 | — |
| Light resistance | | A | A | C | — |
| Brightness retention rate - II (%) | | 79 | 80 | 79 | — |
| Heat resistance | | B | B | B | — |

TABLE 14

|  |  | Comparative Example 10 | Comparative Example 11 | Comparative Example 12 | Comparative Example 13 | Comparative Example 14 |
|---|---|---|---|---|---|---|
| Silicone resin (refractive index: 1.53) | | 100 parts | 100 parts | 100 parts | 100 parts | 100 parts |
| Phosphor (YAG) | | 600 parts | 200 parts | 1100 parts | 600 parts | 600 parts |
| Silicone fine particle 1 (particle size: 0.5 μm) | | 25 parts | 25 parts | 25 parts | 25 parts | 25 parts |
| Metal oxide particle 1 (particle size: 7 nm, refractive index: 1.48) | | — | — | — | 10 | — |
| Metal oxide particle 2 (particle size: 12 nm, refractive index: 1.48) | | — | — | — | — | — |
| Metal oxide particle 3 (particle size: 13 nm, refractive index: 1.76) | | — | 10 parts | 10 parts | — | — |
| Metal oxide particle 4 (particle size: 30 nm, refractive index: 1.76) | | — | — | — | — | — |
| Metal oxide particle 5 (particle size: 36 nm, refractive index: 2.62) | | — | — | — | — | — |
| Metal oxide particle 6 (particle size: 100 nm, refractive index: 1.76) | | — | — | — | — | — |
| Metal oxide particle 7 (particle size: 200 nm, refractive index: 1.76) | | — | — | — | — | — |
| Metal oxide particle 9 (particle size: 500 nm, refractive index: 1.76) | | — | — | — | — | 10 parts |
| Physical property values of phosphor sheet | Elastic modulus (MPa) | 1250 | 274 | — | 1020 | 1047 |
|  | Elongation at break (%) | 2.2 | 33.5 | — | 4.4 | 6.2 |
| Sheet thickness (μm) | | 75 | 75 | — | 75 | 75 |
| Cutting workability | Number of normally cut pieces out of 100 pieces | 62 | 100 | — | 54 | 71 |
| LED light-up test | Color temperature variation (K) | 245 | 41 | — | 268 | 205 |
| Brightness (cd/cm2) | | 1.507 | 1.524 | — | 1.533 | 1.529 |
| Brightness retention rate-I (%) | | 95 | 68 | — | 93 | 94 |
| Light resistance | | S | C | — | A | A |
| Brightness retention rate-II (%) | | 75 | 79 | — | 80 | 79 |
| Heat resistance | | B | B | — | B | B |

The invention claimed is:

1. A phosphor-containing resin sheet, comprising:
   a phosphor;
   a resin;
   metal oxide particles (I) having an average particle size of 10 to 200 nm in an amount of 1 to 30 parts by mass with respect to 100 parts by mass of said resin; and
   metal oxide particles (II) having an average particle size of 300 to 1,000 nm in an amount of 0.01 to 20 parts by mass with respect to 100 parts by mass of said resin;
   wherein
   said phosphor-containing resin sheet comprises said phosphor in an amount of 250 to 1,000 parts by mass with respect to 100 parts by mass of said resin; and
   the phosphor-containing resin sheet has a tensile elastic modulus of 300 to 1,000 MPa.

2. The phosphor-containing resin sheet according to claim 1, wherein the difference in refractive index between said metal oxide particles (II) and said resin is 0.06 or greater.

3. The phosphor-containing resin sheet according to claim 1, further comprising silicone fine particles having an average particle size of 0.1 to 2 μm.

4. The phosphor-containing resin sheet according to claim 3, comprising said silicone fine particles in an amount of 5 to 50 parts by mass with respect to 100 parts by mass of said resin.

5. The phosphor-containing resin sheet according to claim 1, wherein the phosphor-containing resin sheet has at least one feature selected from the group consisting of the following features:
   (i) said metal oxide particles (I) comprise alumina;
   (ii) the phosphor-containing resin sheet has a thickness of 20 to 150 μm;
   (iii) the phosphor-containing resin sheet has a tensile elongation at break of 5 to 30%; and
   (iv) said resin comprises a silicone resin.

6. A light-emitting device, in which the phosphor-containing resin sheet according to claim 1 is pasted on an LED light-emitting element.

7. A method of producing a light-emitting device, said method comprising the step of pasting the phosphor-containing resin sheet according to claim 1 on an LED light-emitting element.

8. The method of producing a light-emitting device according to claim 7, said method comprising, before said step of pasting said phosphor-containing resin sheet on said LED light-emitting element, the step of cutting said phosphor-containing resin sheet into pieces.

9. The method of producing a light-emitting device according to claim 8, comprising forming a groove to a desired depth on a base material simultaneously with cutting said phosphor-containing resin sheet into pieces.

10. The method of producing a light-emitting device according to claim 7, wherein said LED light-emitting element is a wafer-level LED light-emitting element.

11. The method of producing a light-emitting device according to claim 10, comprising the steps of: pasting said phosphor-containing resin sheet on said wafer-level LED light-emitting element; and subsequently cutting the resultant simultaneously with dicing a wafer.

12. A method of producing a phosphor-dispersed resin composition for preparation of a phosphor layer, said method comprising the step of mixing a phosphor, a resin and metal oxide particles, wherein
   said metal oxide particles comprise metal oxide particles (I) having an average particle size of 10 to 200 nm in an amount of 1 to 30 parts by mass with respect to 100 parts by mass of said resin, and metal oxide particles (II) having an average particle size of 300 to 1,000 nm in an amount of 0.01 to 20 parts by mass, with respect to 100 parts by mass of said resin; and
   said phosphor-dispersed resin composition comprises said phosphor in an amount of 250 to 1,000 parts by mass with respect to 100 parts by mass of said resin.

13. The method of producing a phosphor-dispersed resin composition according to claim 12, wherein the difference in refractive index between said metal oxide particles (II) and said resin is 0.06 or greater.

14. The method of producing a phosphor-dispersed resin composition according to claim 12, wherein silicone fine particles having an average particle size of 0.1 to 2 μm are further mixed in said step of mixing.

15. The method of producing a phosphor-dispersed resin composition according to claim 14, wherein said silicone fine particles are mixed in an amount of 5 to 50 parts by mass with respect to 100 parts by mass of said resin.

16. The method of producing a phosphor-dispersed resin composition according to claim 12, wherein said metal oxide particles (I) comprise alumina.

17. A method of producing a phosphor-containing resin sheet, said method comprising:
   producing a phosphor-dispersed resin composition by the method according to claim 12;
   subsequently coating said phosphor-dispersed resin composition on a base material; and
   drying the coated composition,
   wherein the phosphor-containing resin sheet has a tensile elastic modulus of 300 to 1,000 MPa.

18. A method of producing a light-emitting device, comprising the steps of:
   producing a phosphor-containing resin sheet by the method according to claim 17; and
   subsequently pasting said phosphor-containing resin sheet on an LED light-emitting element.

* * * * *